(12) United States Patent
Li et al.

(10) Patent No.: US 11,195,717 B2
(45) Date of Patent: Dec. 7, 2021

(54) SEMICONDUCTOR DEVICE AND METHOD

(71) Applicant: Taiwan Semiconductor Manufacturing Co., Ltd., Hsinchu (TW)

(72) Inventors: Dong-Sheng Li, Hsinchu (TW); Chia-Hui Lin, Dajia Township (TW); Kai Hung Cheng, Tainan (TW); Yao-Hsu Sun, Hsinchu (TW); Wen-Cheng Wu, Kaohsiung (TW); Bo-Cyuan Lu, New Taipei (TW); Sung-En Lin, Hsinchu County (TW); Tai-Chun Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/983,187

(22) Filed: Aug. 3, 2020

(65) Prior Publication Data

US 2020/0373154 A1 Nov. 26, 2020

Related U.S. Application Data

(63) Continuation of application No. 16/430,114, filed on Jun. 3, 2019, now Pat. No. 10,734,227.
(Continued)

(51) Int. Cl.
*H01L 21/02* (2006.01)
*H01L 21/027* (2006.01)
(Continued)

(52) U.S. Cl.
CPC ...... *H01L 21/0276* (2013.01); *H01L 21/0228* (2013.01); *H01L 21/02164* (2013.01); *H01L 21/02274* (2013.01); *H01L 21/02282* (2013.01); *H01L 21/0332* (2013.01); *H01L 21/0335* (2013.01); *H01L 21/28088* (2013.01); *H01L 21/28185* (2013.01); *H01L 21/31111* (2013.01);
(Continued)

(58) Field of Classification Search
None
See application file for complete search history.

(56) References Cited

U.S. PATENT DOCUMENTS 8,487,378 B2 7/2013 Goto et al.
8,729,634 B2 5/2014 Shen et al.
(Continued)

*Primary Examiner* — Bradley Smith
(74) *Attorney, Agent, or Firm* — Slater Matsil, LLP

(57) ABSTRACT

A four-layer photoresist and method of forming the same are disclosed. In an embodiment, a method includes forming a semiconductor fin; depositing a target layer on the semiconductor fin; depositing a BARC layer on the target layer; depositing a first mask layer over the BARC layer, the first mask layer being deposited using a plasma process with an RF power of less than 50 W; depositing a second mask layer over the first mask layer using a plasma process with an RF power of less than 500 W; depositing a photoresist layer over the second mask layer; patterning the photoresist layer, the second mask layer, the first mask layer, and the BARC layer to form a first mask; and selectively removing the target layer from a first portion of the semiconductor fin using the first mask, the target layer remaining on a second portion of the semiconductor fin.

20 Claims, 26 Drawing Sheets

Related U.S. Application Data

(60) Provisional application No. 62/725,726, filed on Aug. 31, 2018.

(51) Int. Cl.
*H01L 21/033* (2006.01)
*H01L 21/28* (2006.01)
*H01L 21/3213* (2006.01)
*H01L 21/311* (2006.01)
*H01L 21/8238* (2006.01)
*G03F 7/09* (2006.01)
*G03F 7/16* (2006.01)
*G03F 7/20* (2006.01)
*G03F 7/26* (2006.01)

(52) U.S. Cl.
CPC .. *H01L 21/31144* (2013.01); *H01L 21/32133* (2013.01); *H01L 21/32139* (2013.01); *H01L 21/823821* (2013.01); *H01L 21/823842* (2013.01); *H01L 21/823857* (2013.01); *G03F 7/091* (2013.01); *G03F 7/094* (2013.01); *G03F 7/162* (2013.01); *G03F 7/20* (2013.01); *G03F 7/26* (2013.01)

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 9,564,528 B2 | 2/2017 | Yu et al. |
| 2014/0282326 A1 | 9/2014 | Chen et al. |
| 2019/0164759 A1* | 5/2019 | Huang .............. H01J 37/32422 |
| 2019/0371915 A1* | 12/2019 | Liao .................. H01L 21/32136 |
| 2019/0385902 A1 | 12/2019 | Wang et al. |
| 2020/0083345 A1* | 3/2020 | Canaperi ............. H01L 21/0234 |

* cited by examiner

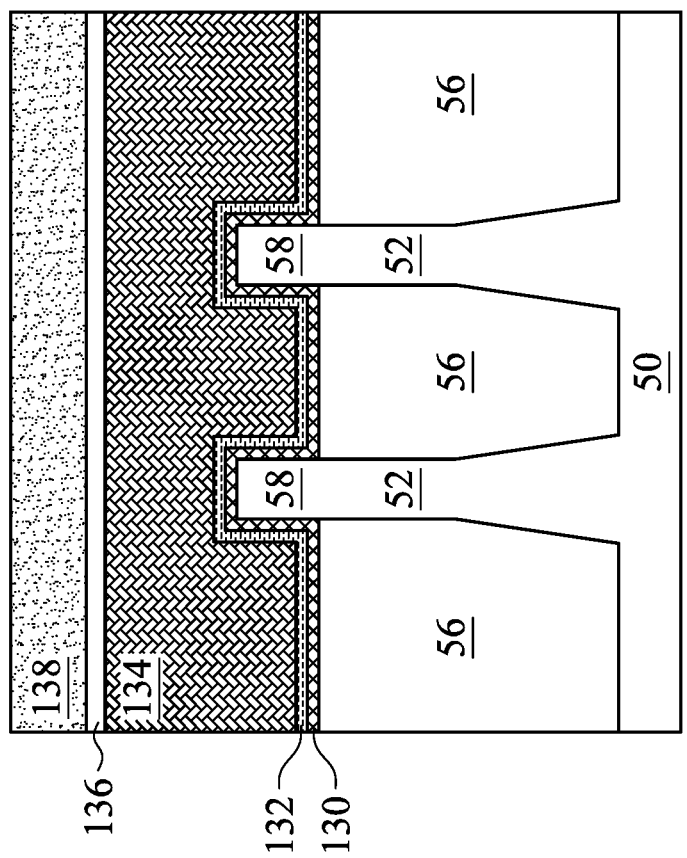
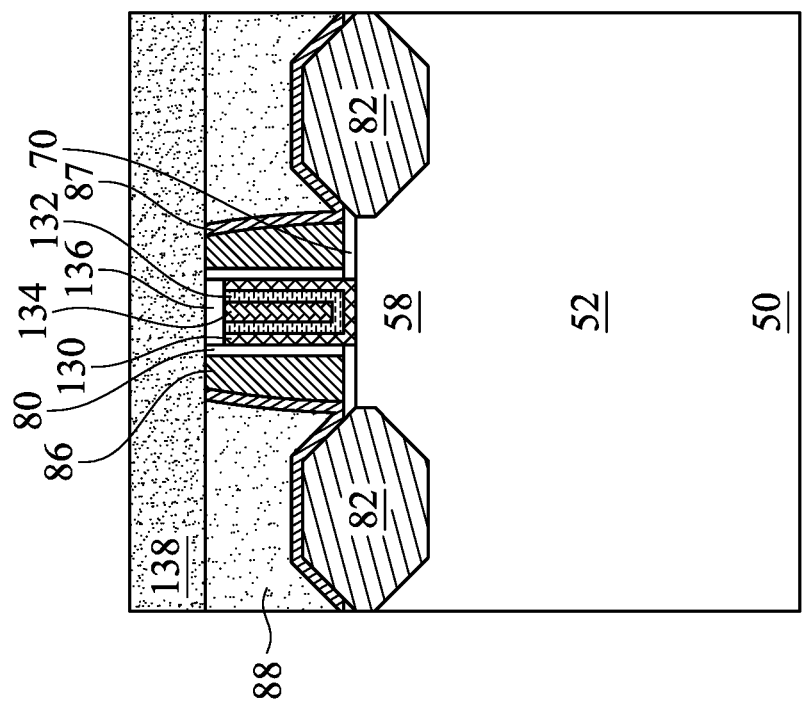
Figure 22A
Figure 22B

SEMICONDUCTOR DEVICE AND METHOD

PRIORITY CLAIM AND CROSS-REFERENCE

This application is a continuation of U.S. patent application Ser. No. 16/430,114, filed Jun. 3, 2019, and entitled "Semiconductor Device and Method," which application claims the benefit of provisionally filed U.S. Patent Application Ser. No. 62/725,726, filed Aug. 31, 2018, and entitled "Semiconductor Device and Method of Manufacture," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14, 15, 16, 17, 18, 19A, 19B, 20, 21A, 21B, 22A, 22B, 23A, and 23B are cross-sectional views of intermediate stages in the manufacturing of FinFETs, in accordance with some embodiments.

DETAILED DESCRIPTION

Figure 1:
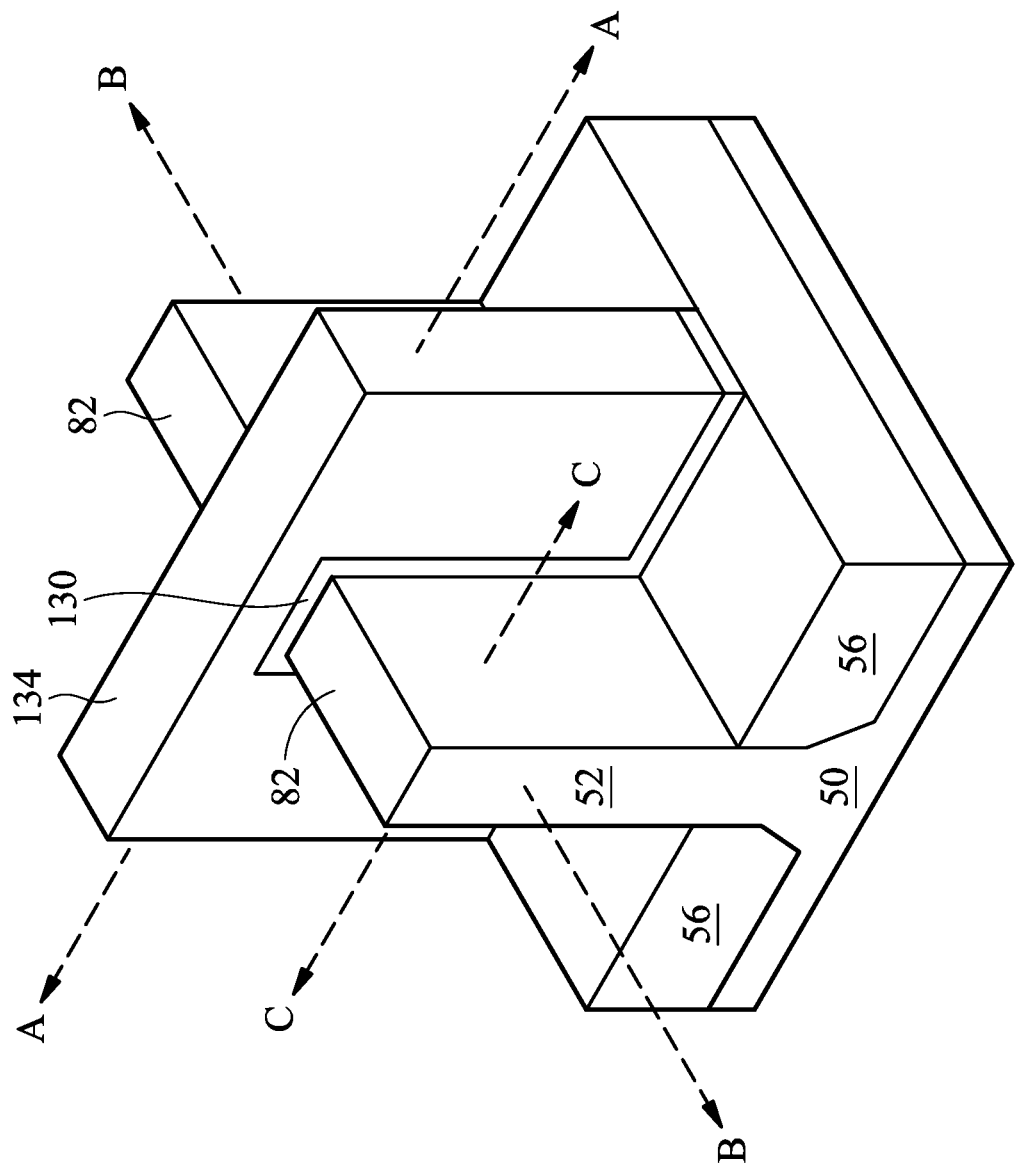
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming improved photoresists. For example, a photoresist may include a bottom anti-reflective coating (BARC) layer, a first hard mask layer, a second hard mask layer, and a photoresist layer. The first hard mask layer and the second hard mask layer may both be formed by low-temperature plasma-enhanced atomic layer deposition (PEALD) processes. The first hard mask layer may be deposited using a low-RF power process (e.g., using an RF power of less than 50 W) and the second hard mask layer may be deposited using a high-RF power process (e.g., using an RF power of less than 500 W). The first hard mask layer protects the BARC layer during the deposition of the second hard mask layer. The first hard mask layer and the second hard mask layer may each comprise silicon dioxide, with the second hard mask layer having a greater concentration of silicon compared to the first hard mask layer. As such, the second hard mask layer is harder and stronger than the first hard mask layer and provide an improved etch stop layer for etching the first photoresist layer. Forming the photoresist according to this method may reduce defects in and damage to the BARC layer. Semiconductor devices manufactured according to embodiments of the present application may experience precise patterning of work function layers and dielectric layers, which may reduce defects and improve device performance. Moreover, the precise patterning method of the present application may be used to pattern dielectric layers and work function layers to be used in a multi-threshold voltage ($V_{th}$) gate.

FIG. 1 illustrates an example of a FinFET in a three-dimensional view, in accordance with some embodiments. The FinFET comprises a fin 52 on a substrate 50 (e.g., a semiconductor substrate). Shallow trench isolation (STI) regions 56 are disposed in the substrate 50, and the fin 52 protrudes above and from between neighboring STI regions 56. Although the STI regions 56 are described and illustrated as being separate from the substrate 50, as used herein the term "substrate" may be used to refer to the substrate 50 alone or the substrate 50 and the STI regions 56 in combination. Additionally, although the fin 52 and the substrate 50 are illustrated as a single, continuous material, the fin 52 and/or the substrate 50 may comprise a single material or a plurality of materials. In this context, the fin 52 refers to the portion extending between the neighboring STI regions 56.

A gate dielectric layer 130 is along sidewalls and over a top surface of the fin 52, and a gate electrode 134 is over the gate dielectric layer 130. Source/drain regions 82 are disposed in opposite sides of the fin 52 with respect to the gate dielectric layer 130 and gate electrode 134. FIG. 1 further illustrates reference cross-sections that are used in later figures. Cross-section A-A is along a longitudinal axis of the gate electrode 134 and in a direction, for example, perpendicular to the direction of current flow between the source/drain regions 82 of the FinFET. Cross-section B-B is perpendicular to the cross-section A-A and is along a longitudinal axis of the fin 52 and in a direction of, for example, a current flow between the source/drain regions 82 of the FinFET. Cross-section C-C is parallel to the cross-section A-A and extends through one of the source/drain regions 82 of the FinFET. Subsequent figures refer to these reference cross-sections for clarity.

Some embodiments discussed herein are discussed in the context of FinFETs formed using a gate-last process. In other embodiments, a gate-first process may be used. In addition, some embodiments contemplate aspects used in planar devices, such as planar FETs.

FIGS. 2 through 23B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. In FIGS. 8A through 13B and FIGS. 21A through 23B, figures ending with an "A" designation are illustrated along reference cross-section A-A illustrated in FIG. 1 and figures ending with a "B" designation are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs. FIGS. 14-20 are illustrated along reference cross-section A-A illustrated in FIG. 1, except for multiple fins/FinFETs.

Figure 2:
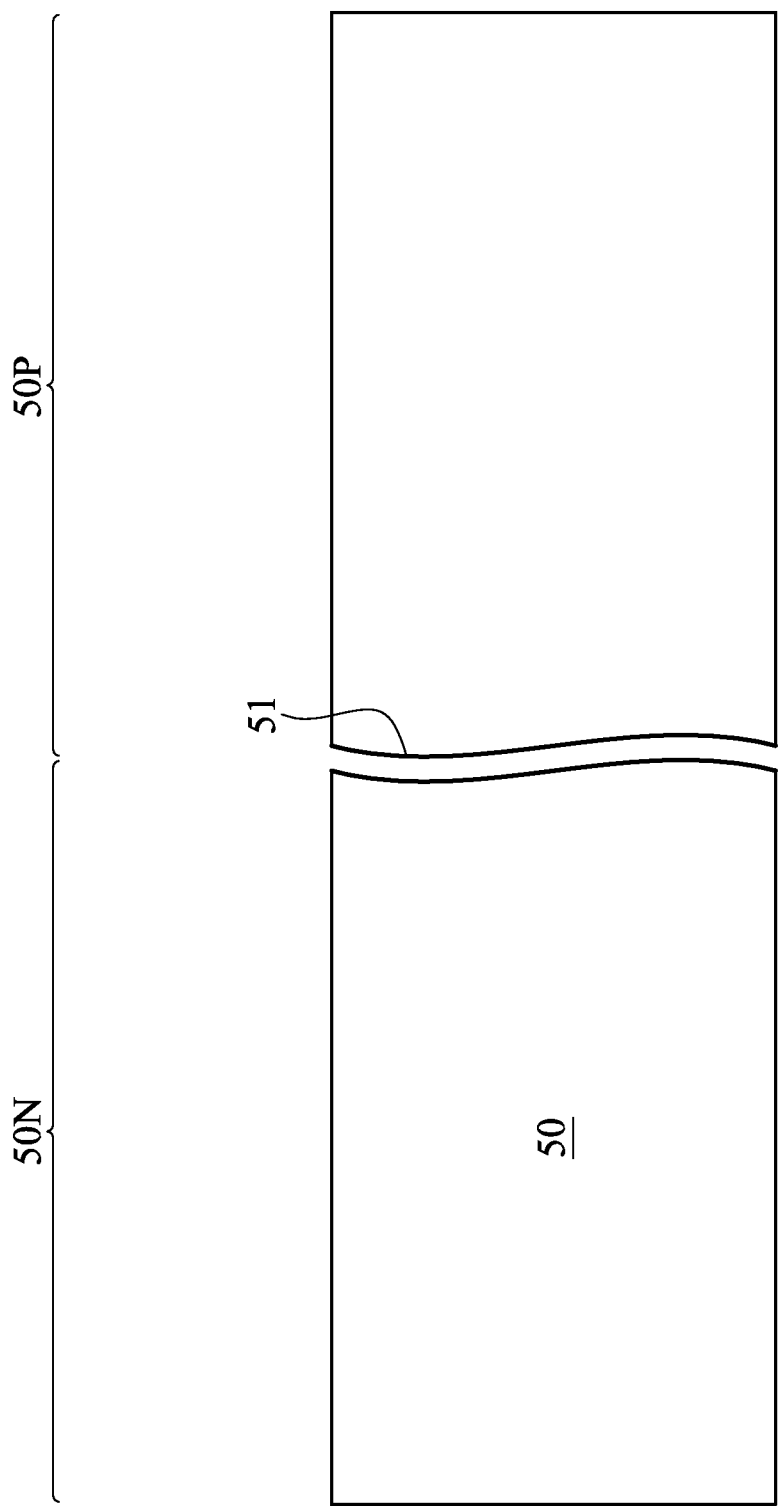

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type dopant or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, which is typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N may be for forming n-type devices, such as NMOS transistors, e.g., n-type FinFETs. The region 50P may be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
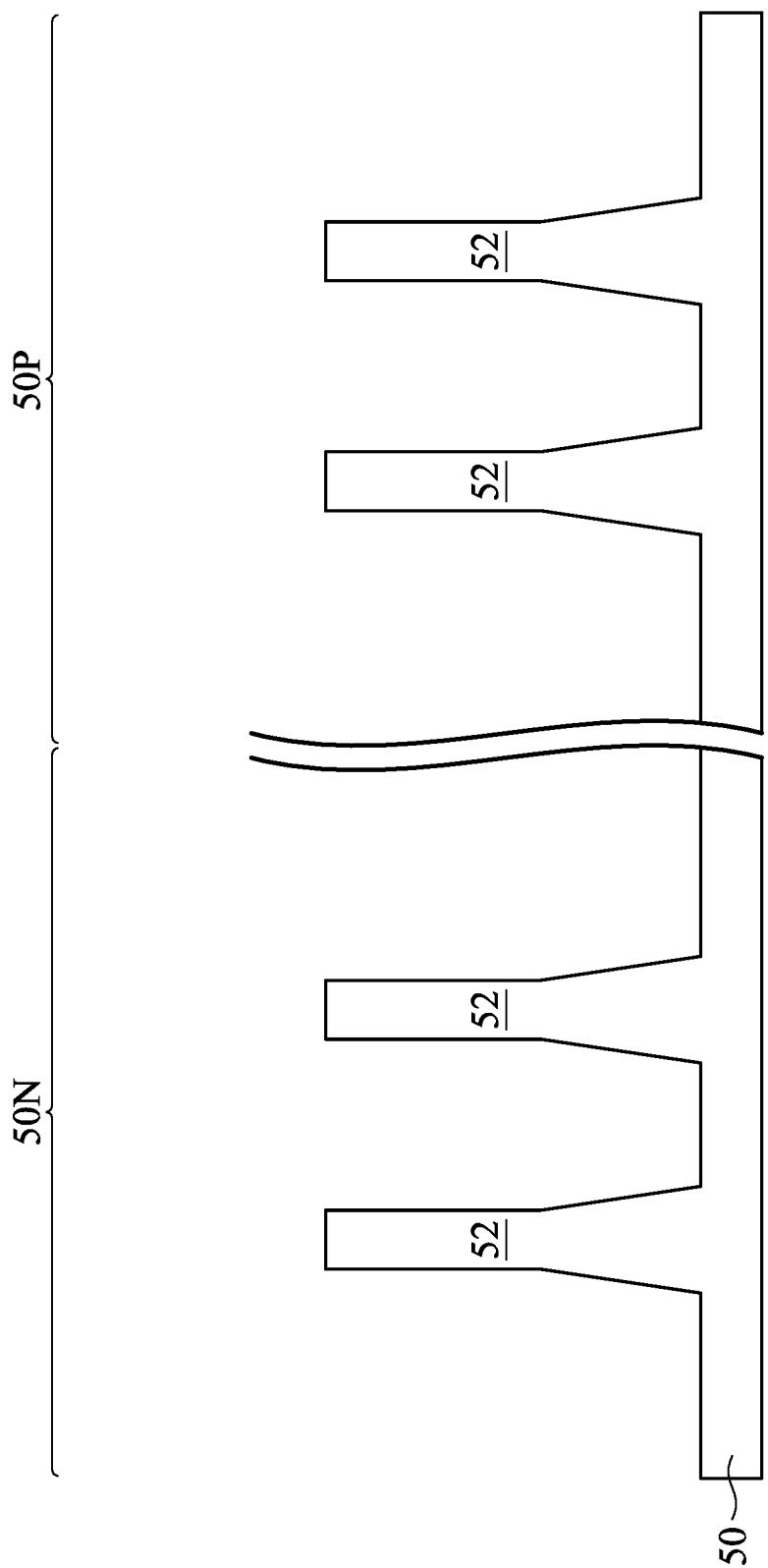

In FIG. 3, fins 52 are formed in the substrate 50. The fins 52 are semiconductor strips. In some embodiments, the fins 52 may be formed in the substrate 50 by etching trenches in the substrate 50. The etching may be one or more of any acceptable etch process, such as a reactive ion etch (RIE), neutral beam etch (NBE), the like, or a combination thereof. The etching may be anisotropic. Although the fins 52 are illustrated in FIG. 3 as having linear edges, the fins 52 may have rounded edges or any other suitable shape.

Any suitable method may be used to pattern the fins 52. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 50 and patterned using a photolithography process. Spacers are formed alongside the patterned sacrificial layer using a self-aligned process. The sacrificial layer is then removed, and the remaining spacers may then be used to pattern the fins 52.

Figure 4:
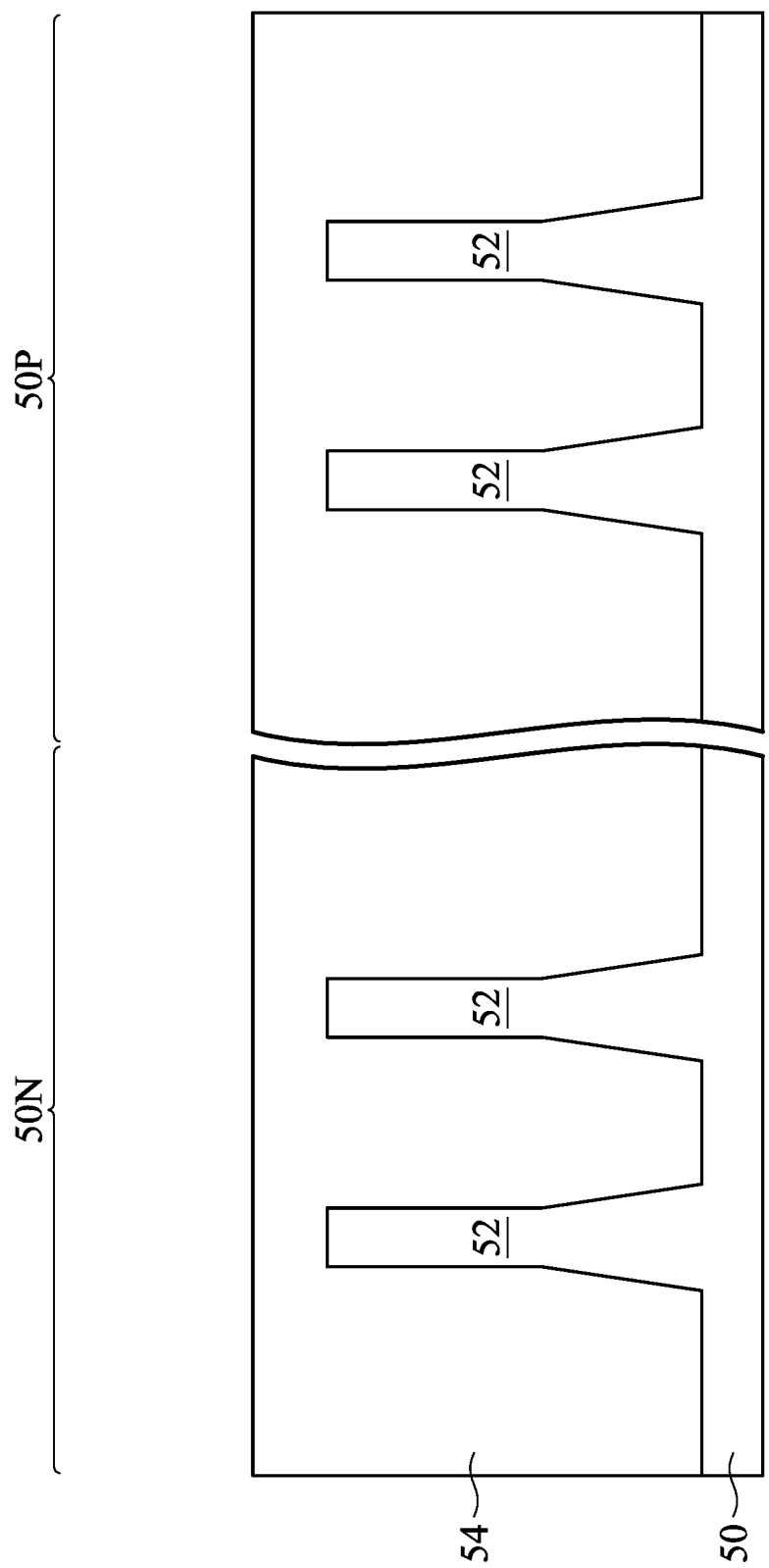

In FIG. 4, an insulation material 54 is formed over the substrate 50 and between neighboring fins 52. The insulation material 54 may be an oxide, such as silicon oxide, a nitride, the like, or a combination thereof, and may be formed by high density plasma chemical vapor deposition (HDP-CVD), flowable chemical vapor deposition (FCVD) (e.g., a CVD-based material deposition in a remote plasma system, followed by a post-deposition cure to convert the material to another material, such as an oxide), the like, or a combination thereof. Other insulation materials formed by any acceptable process may be used. In the illustrated embodiment, the insulation material 54 is silicon oxide formed by an FCVD process. An anneal process may be performed once the insulation material is formed. In an embodiment, the insulation material 54 is formed such that excess insulation material covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
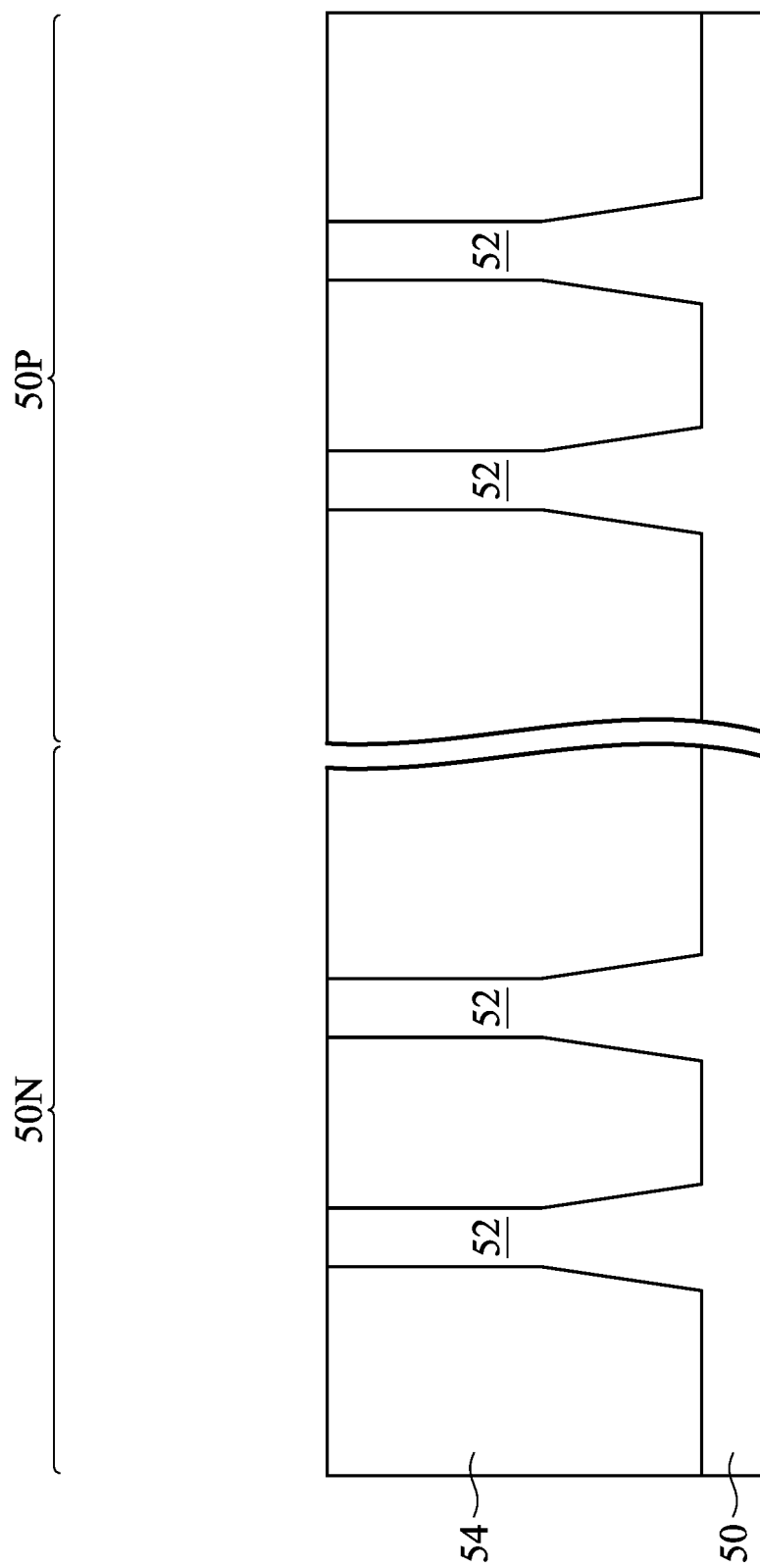

In FIG. 5, a removal process is applied to the insulation material 54 to remove excess material of the insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete.

Figure 6:
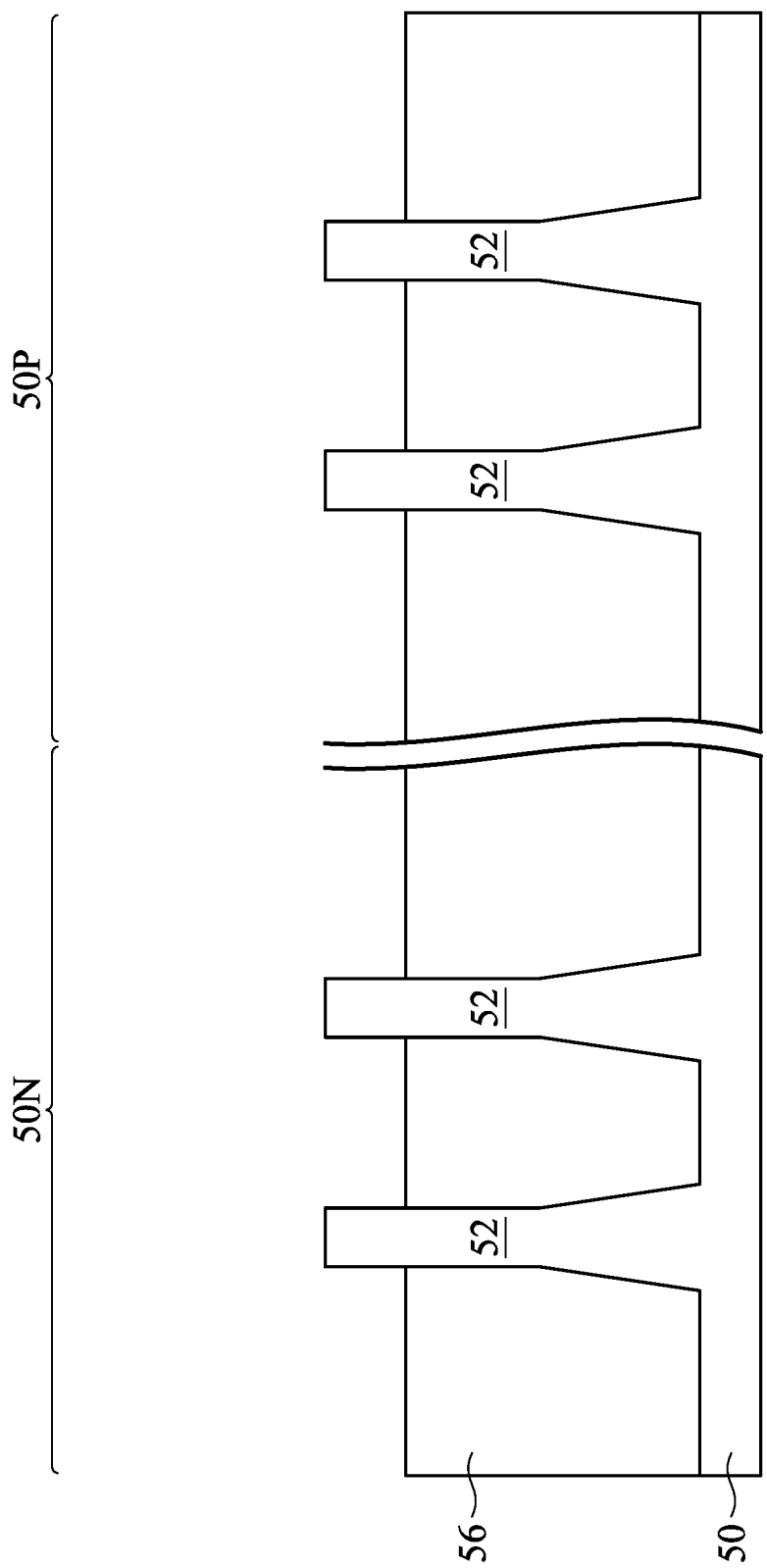

In FIG. 6, the insulation material 54 is recessed to form shallow trench isolation (STI) regions 56. The insulation material 54 is recessed such that fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by using an appropriate etch. The STI regions 56 may be recessed using an acceptable etching process, such as one that is selective to the material of the insulation material 54 (e.g., an etching process which etches the material of the insulation material 54 at a higher rate than the material of the fins 52). For example, a chemical oxide removal using a plasma-less gaseous etching process (e.g., an etching process using hydrogen fluoride (HF) gas, ammonia ($NH_3$) gas, or the like), a remote plasma assisted dry etch process (e.g., a process using hydrogen ($H_2$), nitrogen trifluoride ($NF_3$), and ammonia by-products, or the like), or dilute hydrofluoric (dHF) acid may be used.

The process described with respect to FIGS. 2 through 6 is just one example of how the fins 52 may be formed. In some embodiments, the fins 52 may be formed by an epitaxial growth process. For example, a dielectric layer may be formed over a top surface of the substrate 50, and trenches may be etched through the dielectric layer to expose the underlying substrate 50. Homoepitaxial structures may be epitaxially grown in the trenches, and the dielectric layer may be recessed such that the homoepitaxial structures protrude from the dielectric layer to form the fins 52.

Additionally, in some embodiments, heteroepitaxial structures may be used for the fins 52. For example, the fins 52 in FIG. 5 may be recessed, and a material different from the fins 52 may be epitaxially grown in their place. In a further embodiment, a dielectric layer may be formed over a top surface of the substrate 50, and trenches may be etched through the dielectric layer. Heteroepitaxial structures may then be epitaxially grown in the trenches using a material different from the substrate 50, and the dielectric layer may be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the region 50N (e.g., an NMOS region) different from the material in the region 50P (e.g., a PMOS region). In various embodiments, the fins 52 may be formed from silicon germanium ($Si_xGe_{1-x}$, where x may be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not separately illustrated) may be formed in the fins 52 and/or the substrate 50. In some embodiments, a P well may be formed in the region 50N and an N well may be formed in the region 50P. In some embodiments, a P well or an N well may be formed in both the region 50N and the region 50P.

In embodiments in which different well types are formed, the different implant steps for the region 50N and the region 50P may be achieved using a photoresist or other masks (not separately illustrated). For example, a photoresist may be formed over the fins 52 and the STI regions 56 in the region 50N and the region 50P. The photoresist is patterned to expose the region 50P of the substrate 50, such as the PMOS region. The photoresist may be formed by using a spin-on technique and may be patterned using acceptable photolithography techniques. Once the photoresist is patterned, an n-type impurity implant is performed in the region 50P, and the photoresist may act as a mask to substantially prevent n-type impurities from being implanted such as between about $10^{17}$ cm$^{-3}$ and about $10^{18}$ cm$^{-3}$. After the implant, the photoresist is removed, such as by an acceptable ashing process.

Following the implanting of the region 50P, a second photoresist is formed over the fins 52 and the STI regions 56 in the region 50N and the region 50P. The photoresist is patterned to expose the region 50N of the substrate 50, such as the NMOS region. The photoresist may be formed by using a spin-on technique and may be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations. According to some embodiments, in situ and implantation doping may be used together.

Figure 7:
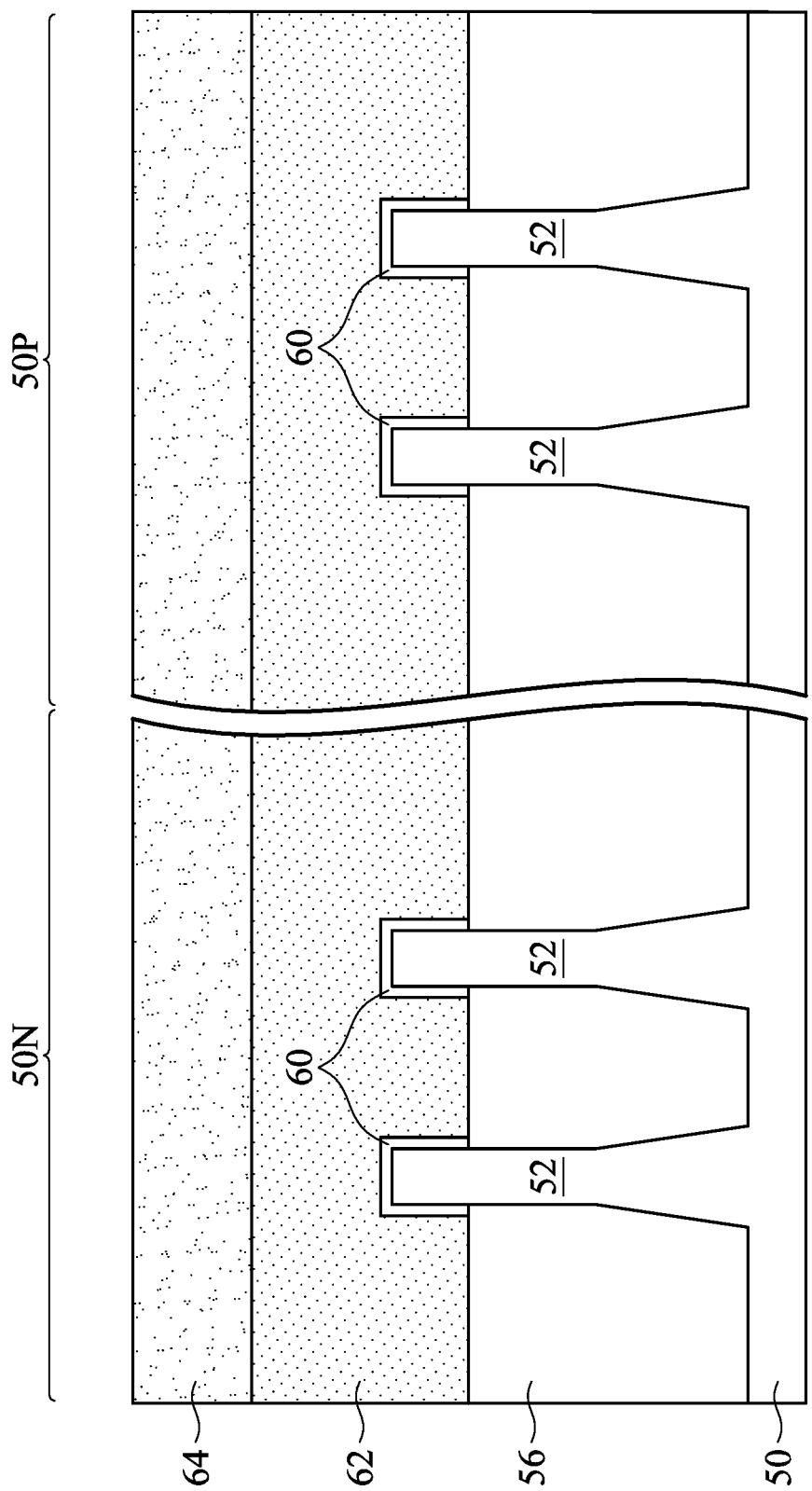

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group amorphous silicon, including polycrystalline silicon (polysilicon), polycrystalline silicon-germanium (poly-SiGe), metallic nitrides, metallic silicides, metallic oxides, and metals. The dummy gate layer 62 may be deposited by physical vapor deposition (PVD), chemical vapor deposition (CVD), sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. In some embodiments, separate dummy gate layers may be formed in the region 50N and the region 50P, and separate mask layers may be formed in the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 13B illustrate various additional steps in the manufacturing of embodiment devices. FIGS. 8A through 13B illustrate features in either of the region 50N and the region 50P. For example, the structures illustrated in FIGS. 8A through 13B may be applicable to both the region 50N and the region 50P. Differences (if any) in the structures of the region 50N and the region 50P are described in the text accompanying each figure.

Figure 8B:
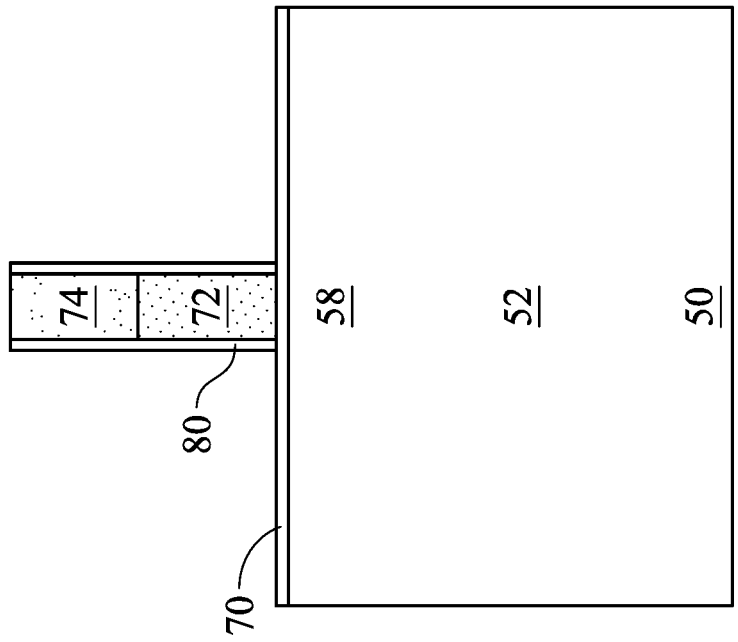
Figure 8A:
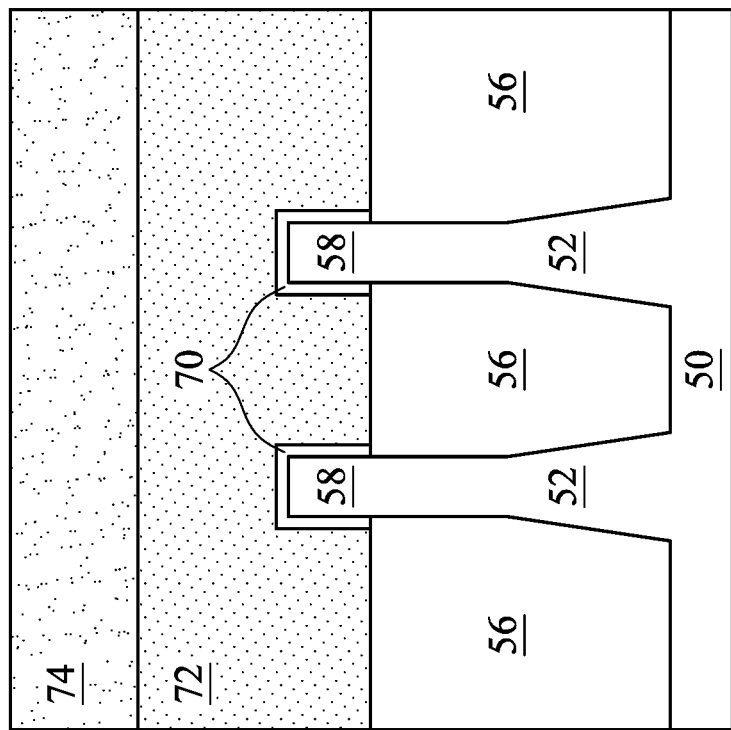

In FIGS. 8A and 8B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72 and dummy dielectrics 70, respectively. The dummy gates 72 cover respective channel regions 58 of the fins 52. The pattern of the masks 74 may be used to physically separate each of the dummy gates 72 from adjacent dummy gates 72. The dummy gates 72 may also have a lengthwise direction substantially perpendicular to the lengthwise direction of respective fins 52.

The mask layer 64 and the dummy gate layer 62 may be patterned by any suitable method. For example, the mask layer 64 and the dummy gate layer 62 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the mask layer 64 and patterned using a photolithography process. Spacers are formed alongside the patterned sacrificial layer using a self-aligned process. The sacrificial layer is then removed, and the remaining spacers may then be used to pattern the mask layer 64 and the dummy gate layer 62.

FIGS. 8A and 8B further illustrate the formation of gate seal spacers 80 on exposed surfaces of the dummy gates 72, the masks 74, the dummy dielectrics 70, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., n-type or p-type) impurities may be implanted into the exposed fins 52 in the region 50P. The mask may then be removed. Subsequently, a mask, such as a photoresist, may be formed over the region 50P while exposing the region 50N, and appropriate type impurities may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
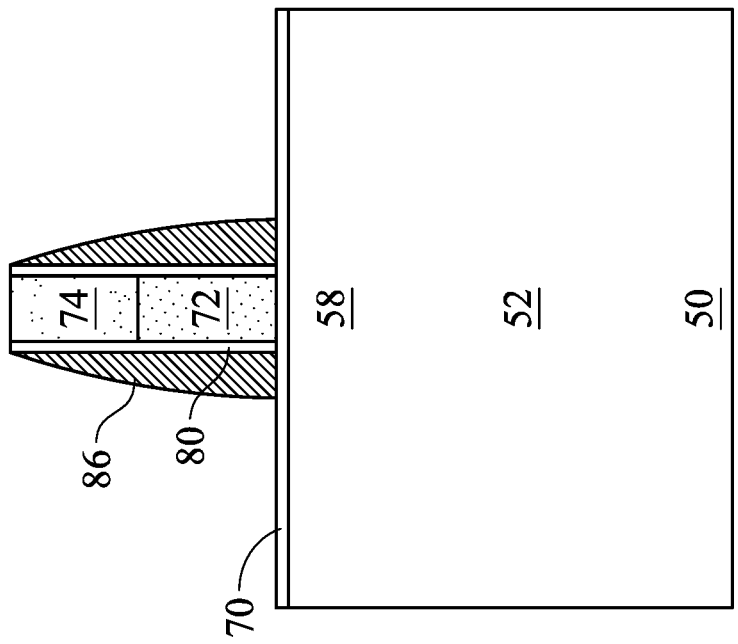
Figure 9A:
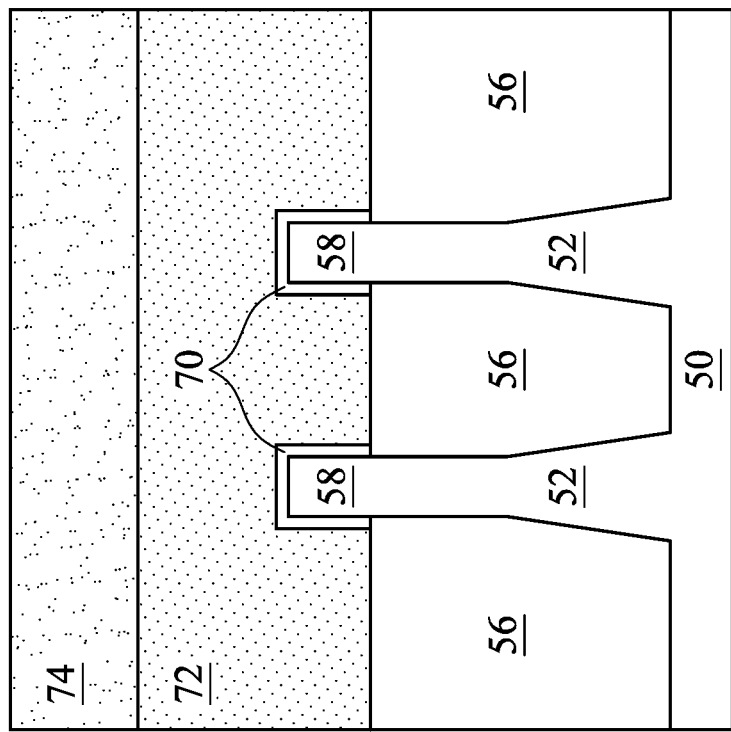

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

Figure 10B:
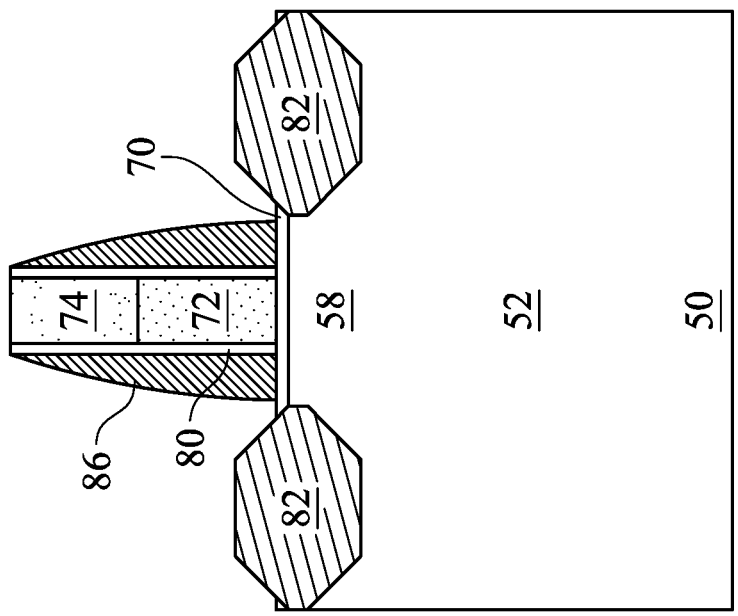
Figure 10A:
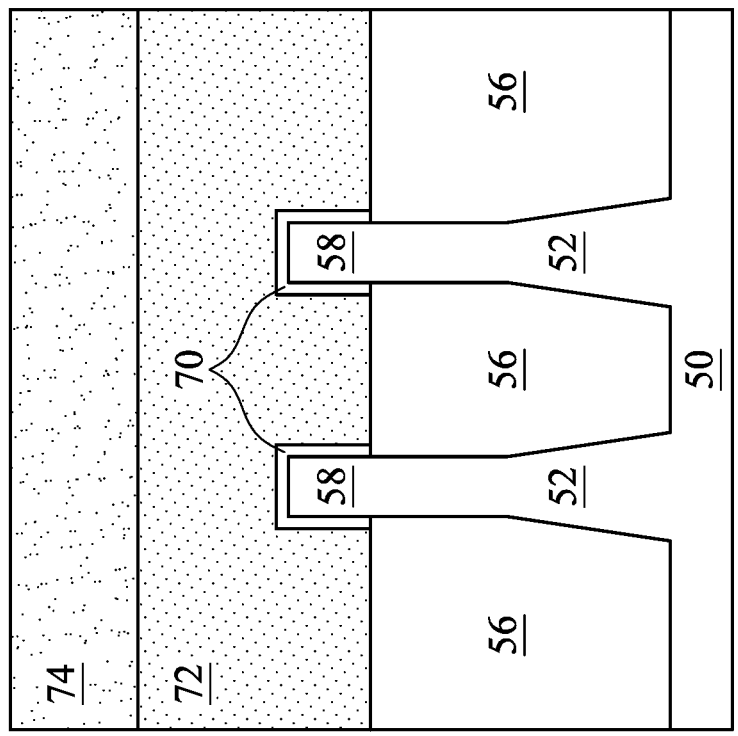
Figure 10C:
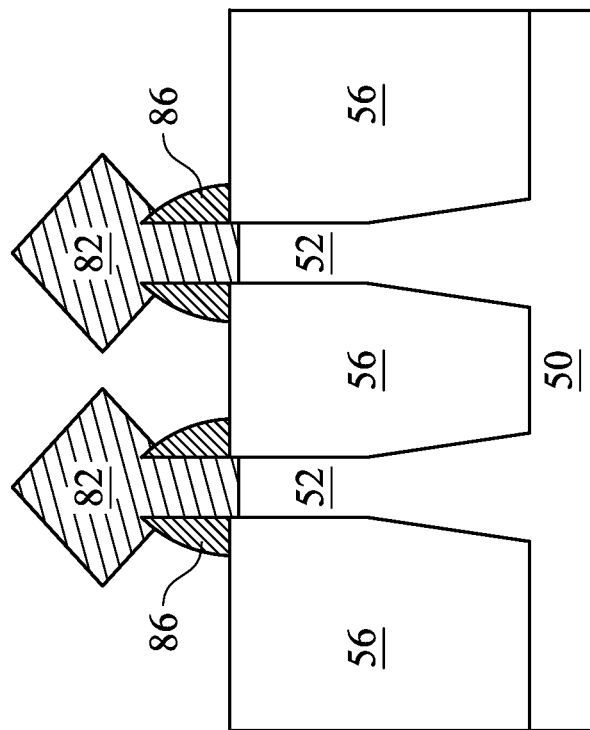
Figure 10D:
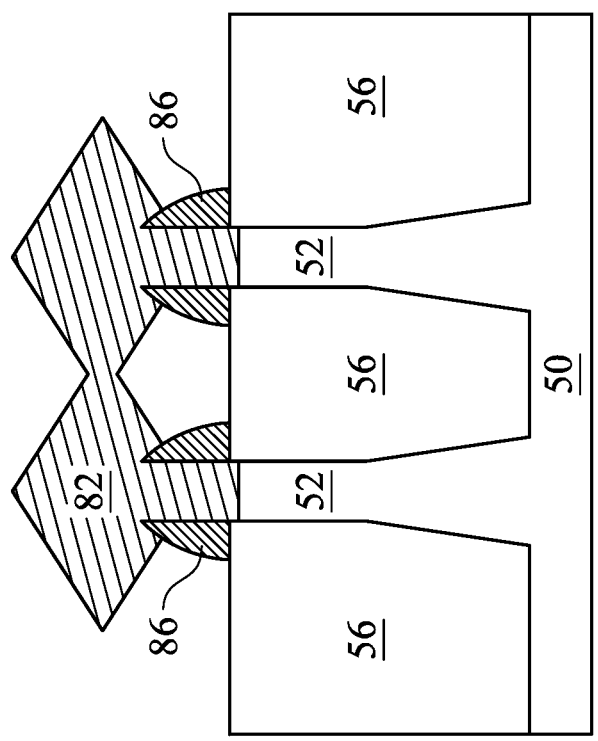

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments, the epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as materials appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as materials appropriate for p-type FinFETs. For example, if the fin 52 is silicon or silicon germanium, the epitaxial source/drain regions 82 in the region second 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Because of the epitaxy processes used to form the epitaxial source/drain regions 82 in the region 50N and the region 50P, upper surfaces of the epitaxial source/drain regions have facets, which expand laterally outward beyond a sidewalls of the fins 52. In some embodiments, these facets cause adjacent epitaxial source/drain regions 82 of a same finFET to merge as illustrated by FIG. 10C. In other embodiments, adjacent epitaxial source/drain regions 82 remain separated after the epitaxy process is completed as illustrated by FIG. 10D.

Figure 11B:
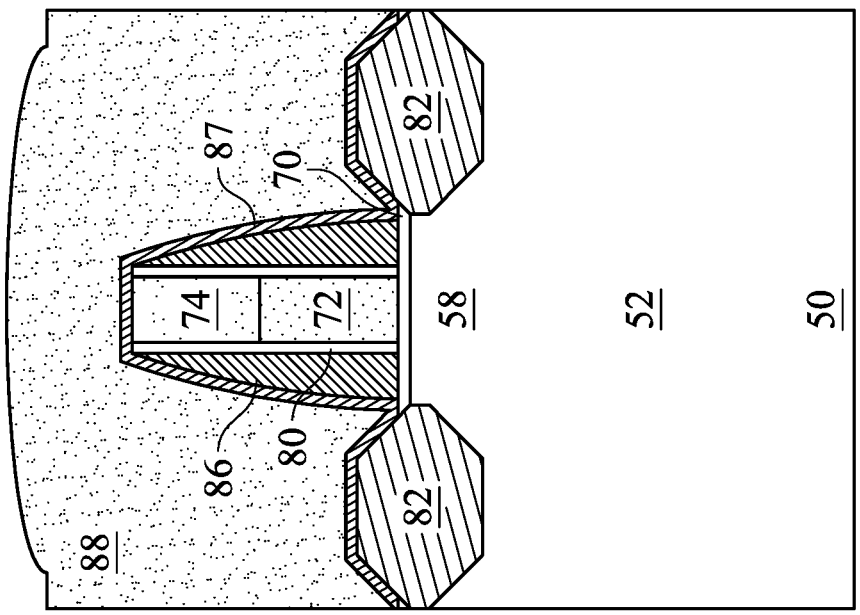
Figure 11A:
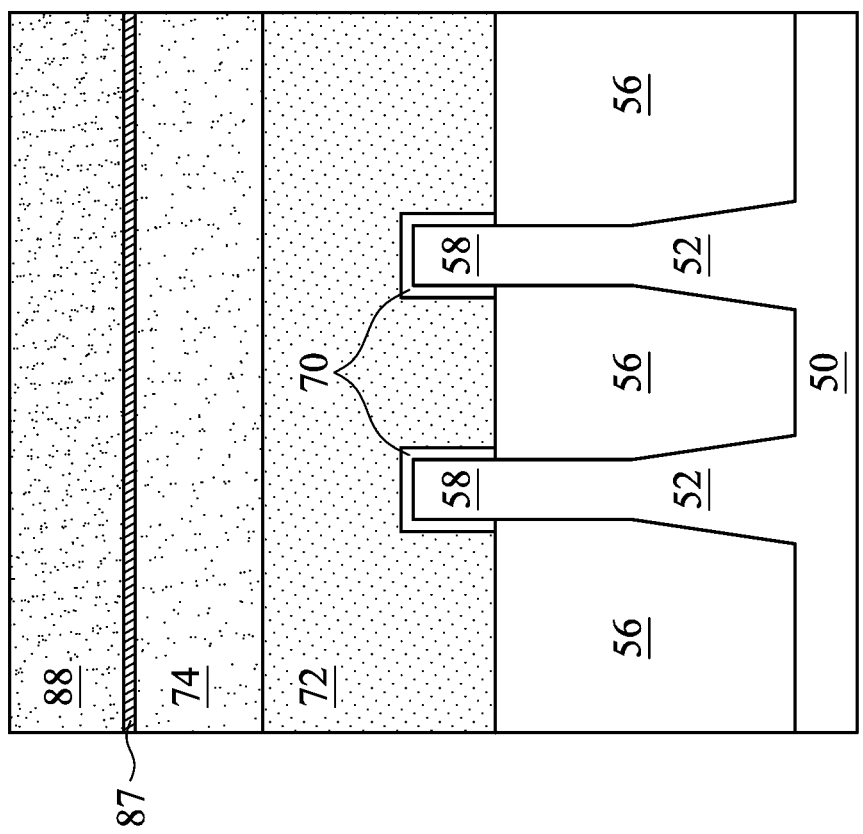

In FIGS. 11A and 11B, a first ILD 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation or semiconductor materials formed by any acceptable process may be used. In some embodiments, a contact etch stop layer (CESL) 87, is disposed between the first ILD 88 and the epitaxial source/drain regions 82, the masks 74, the gate spacers 86, and the gate seal spacers 80. The CESL 87 may comprise a dielectric material, such as, silicon nitride, silicon oxide, silicon oxynitride, combinations thereof, or the like, having a different etch rate than the material of the overlying first ILD 88.

Figure 12B:
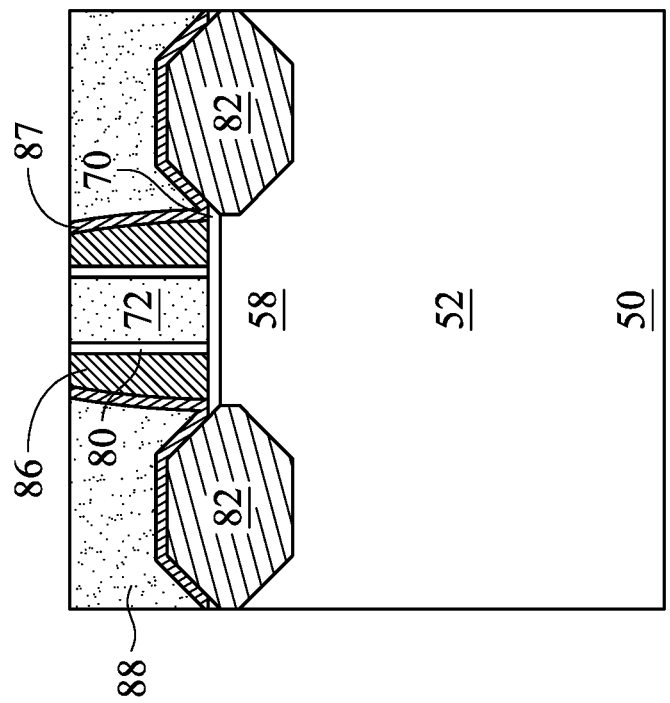
Figure 12A:
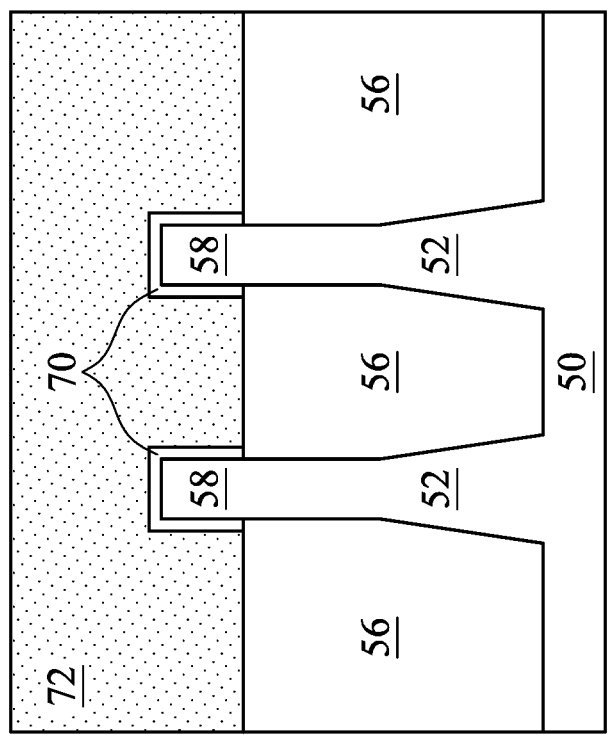

In FIGS. 12A and 12B, a planarization process, such as a CMP, may be performed to level the top surface of the first ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88.

Figure 13B:
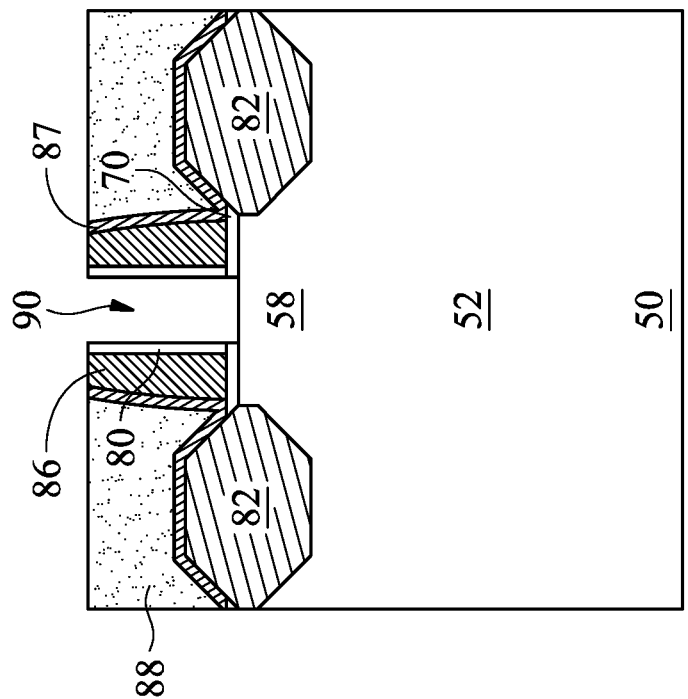
Figure 13A:
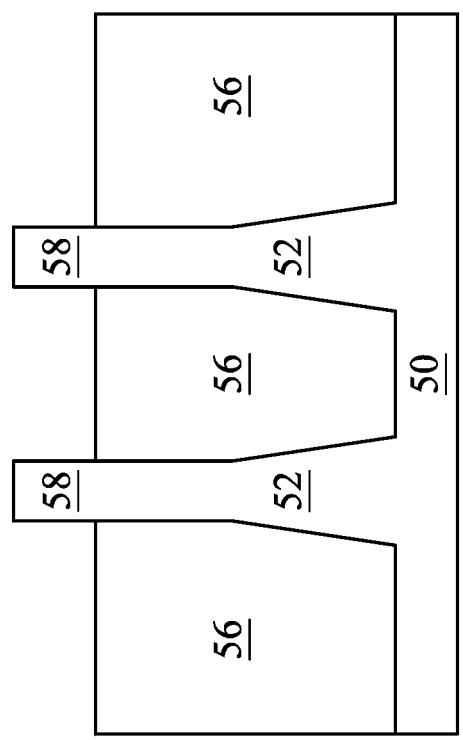

In FIGS. 13A and 13B, the dummy gates 72 and portions of the dummy dielectrics 70 directly underlying the exposed dummy gates 72 are removed in an etching step(s), so that recesses 90 are formed. In some embodiments, the dummy gates 72 are removed by an anisotropic dry etch process. For example, the etch process may include a dry etch process using reaction gas(es) that selectively etch the dummy gates 72 without etching the first ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectrics 70 may be used as etch stop layers when the dummy gates 72 are etched. The dummy dielectrics 70 may then be removed after the removal of the dummy gates 72.

FIGS. 14 through 20 illustrate steps for forming dielectric layers and work function layers over the structure of FIGS. 13A and 13B. The dielectric layers and the work function layers are precisely patterned using a four-layer photoresist 107 (discussed in further detail below). As will be discussed in further detail below, the method illustrated in FIGS. 14 through 20 may be used to form and pattern dielectric layers and work function layers in a first region 96A, a second region 96B, a third region 96C, a fourth region 96D, a fifth region 96E, a sixth region 96F, a seventh region 96G, and an eighth region 96H to be used in a subsequently formed multi-threshold voltage ($V_{th}$) gate. FIGS. 14 through 20 illustrate features in either of the region 50N and the region 50P. Differences (if any) in the structures of the region 50N and the region 50P are described in the text accompanying each figure. FIGS. 14-20 are illustrated along reference cross-section A-A illustrated in FIG. 1, except for multiple fins/FinFETs.

Figure 14:
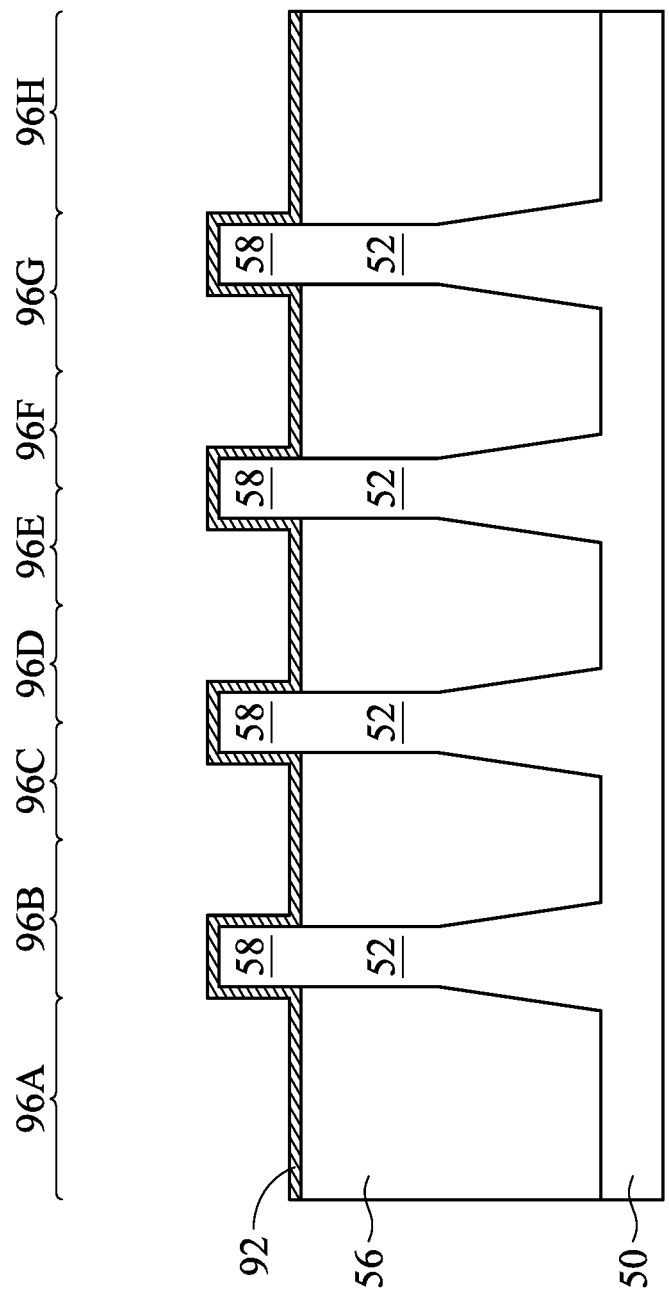

In FIG. 14, a first gate dielectric layer 92 is formed over the structures of FIGS. 13A and 13B. The first gate dielectric layer 92 is deposited conformally on top surfaces and sidewalls of the fins 52 and on top surfaces of the STI regions 56. In accordance with some embodiments, the first gate dielectric layer 92 comprises silicon oxide, silicon nitride, or multilayers thereof. In some embodiments, the first gate dielectric layer 92 is a high-k dielectric material, and in these embodiments, the first gate dielectric layer 92 may have a k value greater than about 7.0, and may include a metal oxide or a silicate of Hf, Al, Zr, La, Mg, Ba, Ti, Pb, and combinations thereof. The formation methods of the first gate dielectric layer 92 may include molecular beam deposition (MBD), atomic layer deposition (ALD), PECVD, and the like. The first gate dielectric layer 92 may have a thickness of between about 13 Å and about 19 Å, such as about 16 Å.

Figure 15:
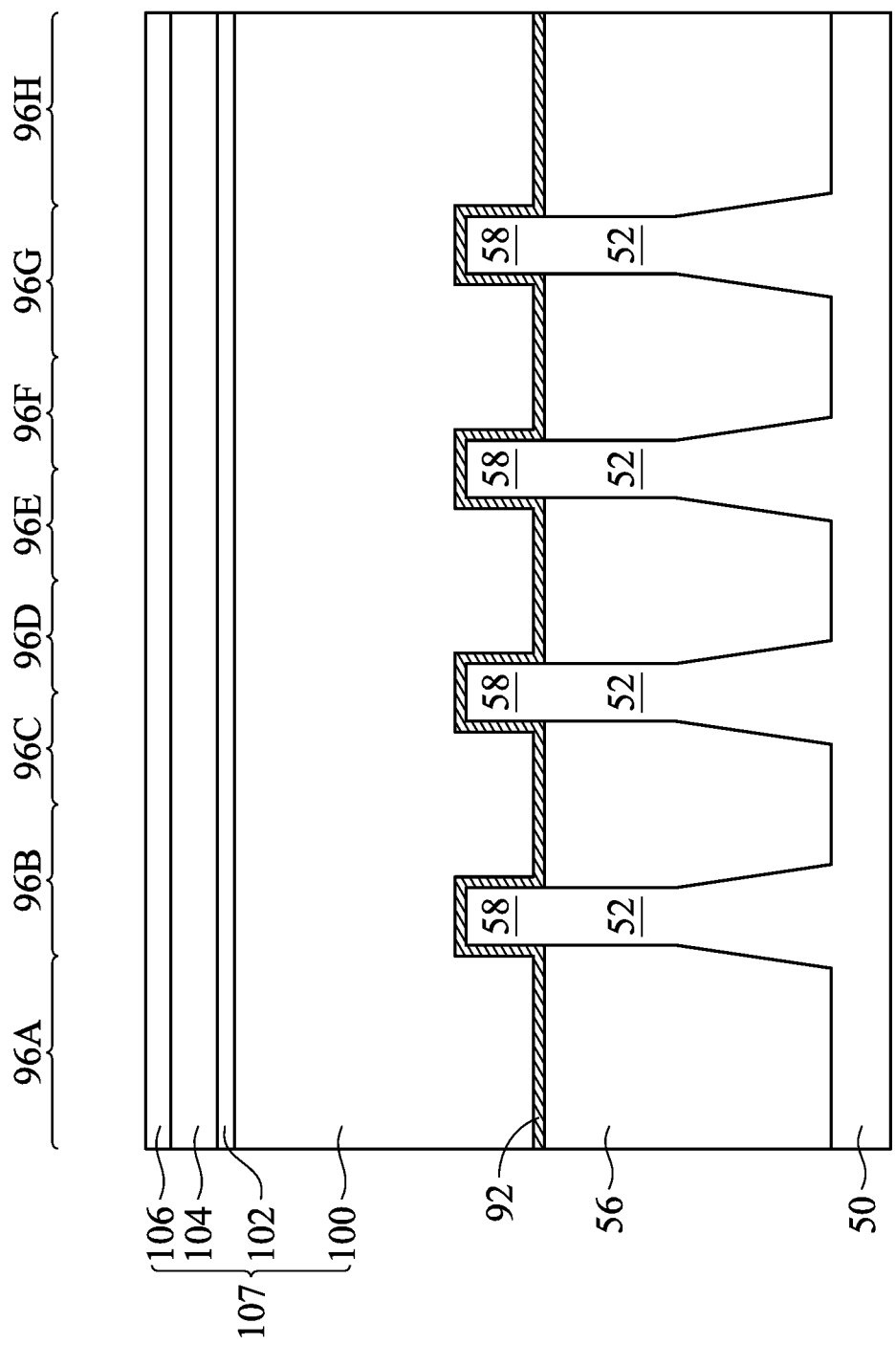

In FIG. 15, a four-layer photoresist 107 including a first bottom anti-reflective coating (BARC) layer 100, a first intermediate mask layer 102, a second intermediate mask layer 104, and a first photoresist layer 106 is formed over the first gate dielectric layer 92. The combination of the first intermediate mask layer 102 and the second intermediate mask layer 104 may be referred to as a first intermediate mask. The first BARC layer 100 may be deposited on the first gate dielectric layer 92 using spin-on coating or the like. As illustrated in FIG. 15, a topmost surface of the first BARC layer 100 may be level.

The first intermediate mask layer 102 is formed over the first BARC layer 100 using a conformal deposition process, such as plasma-enhanced ALD (PEALD). The first intermediate mask layer 102 may be deposited using a low-temperature, low-power plasma process. For example, the first intermediate mask layer 102 may be deposited at a temperature of between about 50° C. and about 150° C. using an RF power of about 50 W or less. The first intermediate mask layer 102 may be formed of silicon oxide having an atomic ratio of silicon to oxygen of about 0.71 or less. The first intermediate mask layer 102 may have a thickness of between about 10 Å and about 100 Å. Because the first intermediate mask layer 102 is formed using a low-temperature, low-power process, the first intermediate mask layer 102 may be formed over the first BARC layer 100 without damaging the first BARC layer 100. In addition, the first intermediate mask layer 102 may protect the first BARC layer 100 from damage by subsequent processes.

The first intermediate mask layer 102 may be deposited by flowing a precursor gas over the first BARC layer 100 at a flow rate of between about 1 standard liter per minute (slpm) and about 3 slpm, such as about 2 slpm, for a period of about 0.2 seconds to adsorb silicon on the surface of the first BARC layer 100. The precursor gas may include N-(Diethylaminosilyl)-N-ethylethanamine, silane ($SiH_4$), disilane ($Si_2H_6$), combinations thereof, or any other silicon-containing precursor. The precursor gas may further include a carrier gas, such as argon. Next, a purge gas, such as argon or the like, is flowed at a flow rate of between about 1 slpm and about 3 slpm, such as about 2 slpm, for a period of about 0.3 seconds. An oxygen plasma treatment is then performed with an oxygen flow rate of between about 2 slpm and about 6 slpm, such as about 4 slpm for a period of about 0.2 seconds to form the first intermediate mask layer 102. The oxygen plasma may be generated using a radio frequency (RF) power source having an RF power of about 50 W or less. An additional purge gas, such as argon or the like, is subsequently flowed at a flow rate of between about 1 slpm and about 3 slpm, such as about 2 slpm, for a period of about 0.1 seconds. A process pressure during the deposition of the first intermediate mask layer 102 may be between about 2.7 Torr and about 3.3 Torr. Depositing the first intermediate mask layer 102 at a low pressure may aid in the conformality of the first intermediate mask layer 102, which improves the evenness and completeness of the etching of the first intermediate mask layer 102. The steps used to deposit the first intermediate mask layer 102 may be repeated until the first intermediate mask layer 102 reaches a desired thickness. In some embodiments, the first intermediate mask layer 102 may be deposited in less than 40 deposition cycles to prevent damage to the first BARC layer 100.

The second intermediate mask layer 104 is formed over the first intermediate mask layer 102 using a conformal deposition process, such as plasma-enhanced ALD (PEALD). The second intermediate mask layer 104 may be deposited using a low-temperature, high-power plasma process. For example, the second intermediate mask layer 104 may be deposited at a temperature of between about 50° C. and about 150° C. using an RF power of about 500 W or less. The second intermediate mask layer 104 may be deposited using an RF power greater than an RF power used while depositing the first intermediate mask layer 102, such as an RF power of greater than 50 W. The second intermediate mask layer 104 may be formed of silicon oxide having an atomic ratio of silicon to oxygen of about 0.75 or greater. The second intermediate mask layer 104 may have a thickness of between about 100 Å and about 500 Å. Forming the second intermediate mask layer 104 using a low-temperature process with an RF power of less than about 500 W helps to protect the first BARC layer 100 from damage during the deposition process of the second intermediate mask layer 104, as compared to other deposition methods. Moreover, the first BARC layer 100 may be protected from the high-power process used to deposit the second intermediate mask layer 104 by the first intermediate mask layer 102.

The second intermediate mask layer 104 may be deposited by flowing a precursor gas over the first intermediate mask layer 102 at a flow rate of between about 1 standard liter per minute (slpm) and about 3 slpm, such as about 2 slpm, for a period of about 0.2 seconds to adsorb silicon on the surface of the first intermediate mask layer 102. The precursor gas may include N-(Diethylaminosilyl)-N-ethylethanamine, silane ($SiH_4$), disilane ($Si_2H_6$), combinations thereof, or any other silicon-containing precursor. The precursor gas may further include a carrier gas, such as argon. Next, a purge gas, such as argon or the like, is flowed at a flow rate of between about 1 slpm and about 3 slpm, such as about 2 slpm, for a period of about 0.3 seconds. An oxygen plasma treatment is then performed with an oxygen flow rate of between about 2 slpm and about 6 slpm, such as about 4 slpm for a period of about 0.2 seconds to form the second intermediate mask layer 104. The oxygen plasma may be generated using an RF power source having an RF power of about 500 W or less. An additional purge gas, such as argon or the like, is subsequently flowed at a flow rate of between about 1 slpm and about 3 slpm, such as about 2 slpm, for a period of about 0.1 seconds. A process pressure during the deposition of the second intermediate mask layer 104 may be between about 2.7 Torr and about 3.3 Torr. Depositing the second intermediate mask layer 104 at a low pressure may aid in the conformality of the second intermediate mask layer 104, which improves the evenness and completeness of the etching of the second intermediate mask layer 104. The steps used to deposit the second intermediate mask layer 104 may be repeated until the second intermediate mask layer 104 reaches a desired thickness.

The first photoresist layer 106 is formed over the second intermediate mask layer 104. The first photoresist layer 106 may be deposited on the second intermediate mask layer 104 using spin-on coating or the like.

The first intermediate mask acts as an etch stop layer and protects the first BARC layer 100 from etching of the first photoresist layer 106, discussed below in reference to FIG. 16. Forming the first intermediate mask as a bi-layer using a low temperature process allows for the first intermediate mask to be formed over the first BARC layer 100, without damaging the first BARC layer 100. Damage to the first BARC layer 100 can lead to the corners of the first BARC layer 100 having a rounded profile in a top-down view (e.g. rounding) after the first BARC layer 100 is etched. However, the deposition process used for the first intermediate mask prevents or at least reduces this rounding of the first BARC layer 100 and provides for precise patterning of underlying layers using the first BARC layer 100 as a mask. Moreover, the second intermediate mask layer 104 has a higher ratio of silicon-to-oxygen than the first intermediate mask layer 102, thus the second intermediate mask layer 104 has a higher strength and hardness than the first intermediate mask layer 102 and provides an improved etch stop layer for etching the first photoresist layer 106. Accordingly, the first BARC layer 100 and underlying layers may be precisely patterned, which improves device performance, decreases defects in subsequently formed devices, and enlarges the process window for subsequent etch processes.

Figure 16:
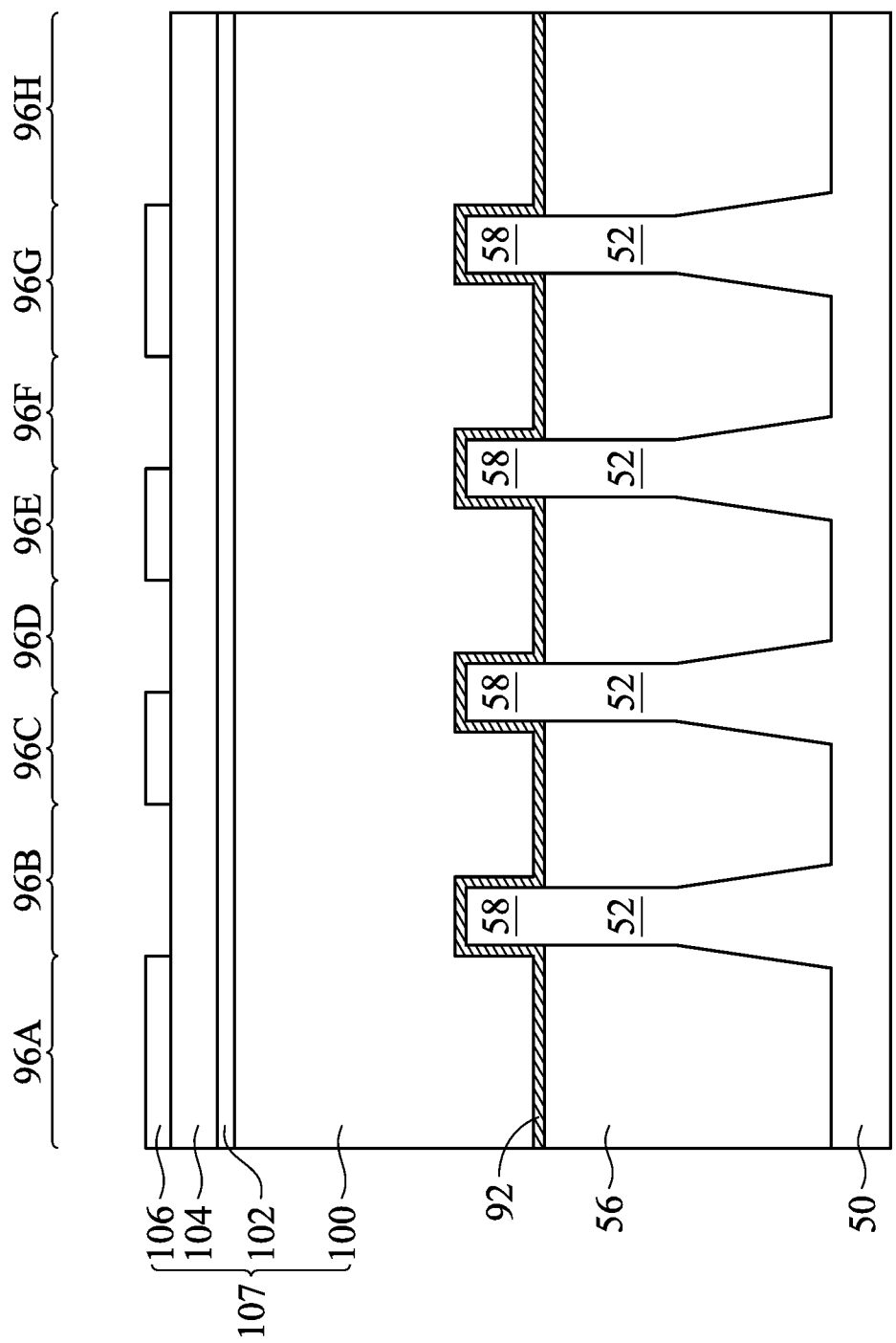

In FIG. 16, the first photoresist layer 106 is etched from the second region 96B, the fourth region 96D, the sixth region 96F, and the eighth region 96H. The first photoresist layer 106 may be patterned by exposing the first photoresist layer 106 to a patterned energy source and developing the first photoresist layer 106 to remove an exposed or unexposed portion of the first photoresist layer 106. In some embodiments, the first photoresist layer 106 may be patterned with immersion lithography using ultraviolet light at a wavelength of 193 nm. After the first photoresist layer 106 is patterned, the first photoresist layer 106 may be used as a mask to etch the underlying layers.

Figure 17:
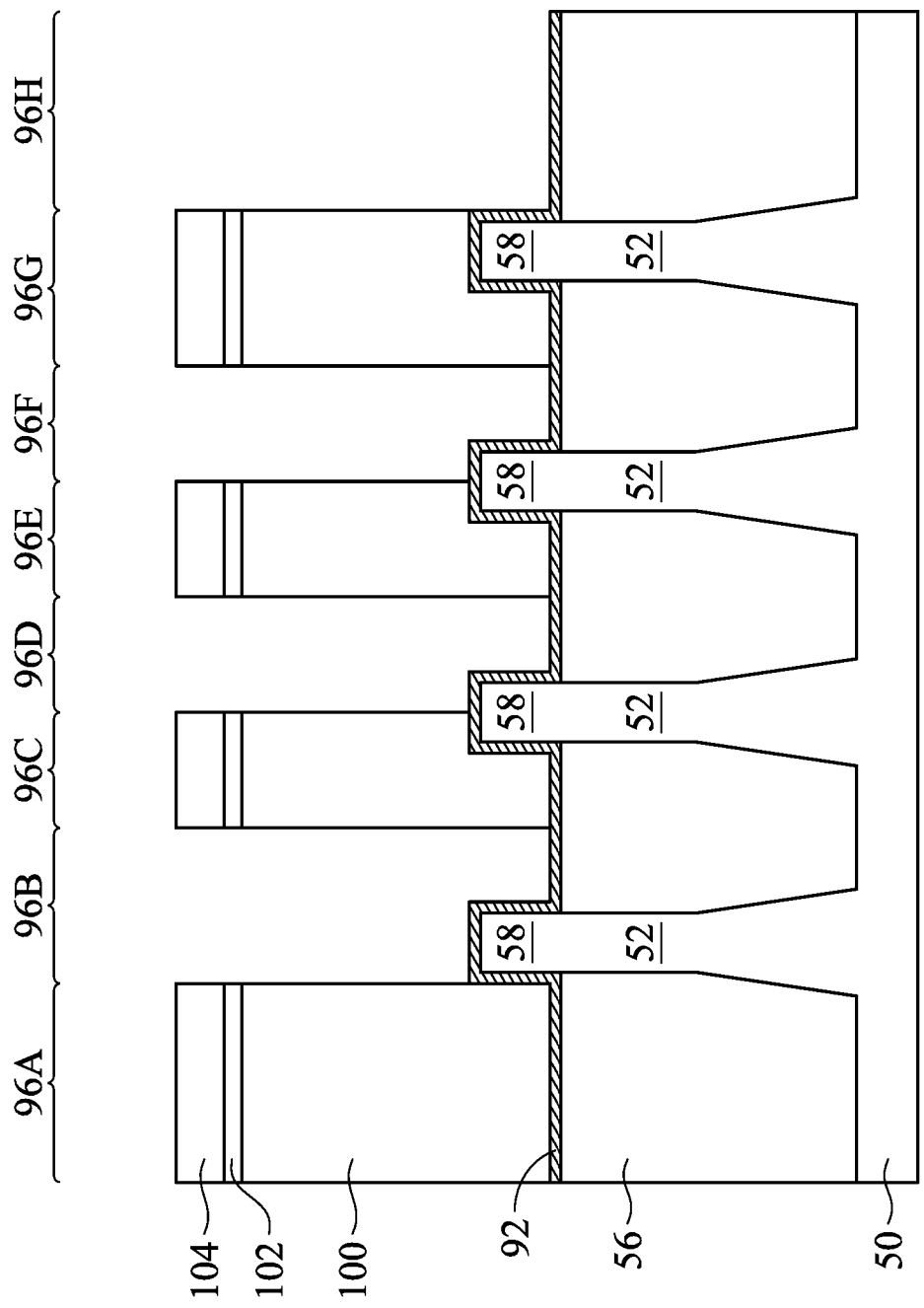

In FIG. 17, the second intermediate mask layer 104, the first intermediate mask layer 102, and the first BARC layer 100 are etched using the patterned first photoresist layer 106 as a mask. The second intermediate mask layer 104, the first intermediate mask layer 102, and the first BARC layer 100 may be etched using an anisotropic etch process. For example, the second intermediate mask layer 104, the first intermediate mask layer 102, and the first BARC layer 100 may be etched using a dry etch process, such as reactive ion etching (RIE), neutral beam etching (NBE), or the like. In some embodiments, the second intermediate mask layer 104, the first intermediate mask layer 102, and the first BARC layer 100 may be etched by a dry etch process using an etching gas including nitrogen ($N_2$), hydrogen ($H_2$), helium (He), or the like. In further embodiments, the second intermediate mask layer 104, the first intermediate mask layer 102, and the first BARC layer 100 may be etched by a dry etch process using a fluorine-containing etching gas such as tetrafluoromethane ($CF_4$), fluoroform ($CHF_3$), difluoromethane ($CH_2F_2$), fluoromethane ($CH_3F$), or the like.

The second intermediate mask layer 104, the first intermediate mask layer 102, and the first BARC layer 100 may be etched simultaneously in an all-in-one etch process. In other embodiments, the second intermediate mask layer 104, the first intermediate mask layer 102, and the first BARC layer 100 may be etched by different etchants in separate processes. After the second intermediate mask layer 104, the first intermediate mask layer 102, and the first BARC layer 100 are etched, the first photoresist layer 106 may be removed, such as by an acceptable ashing process.

Figure 18:
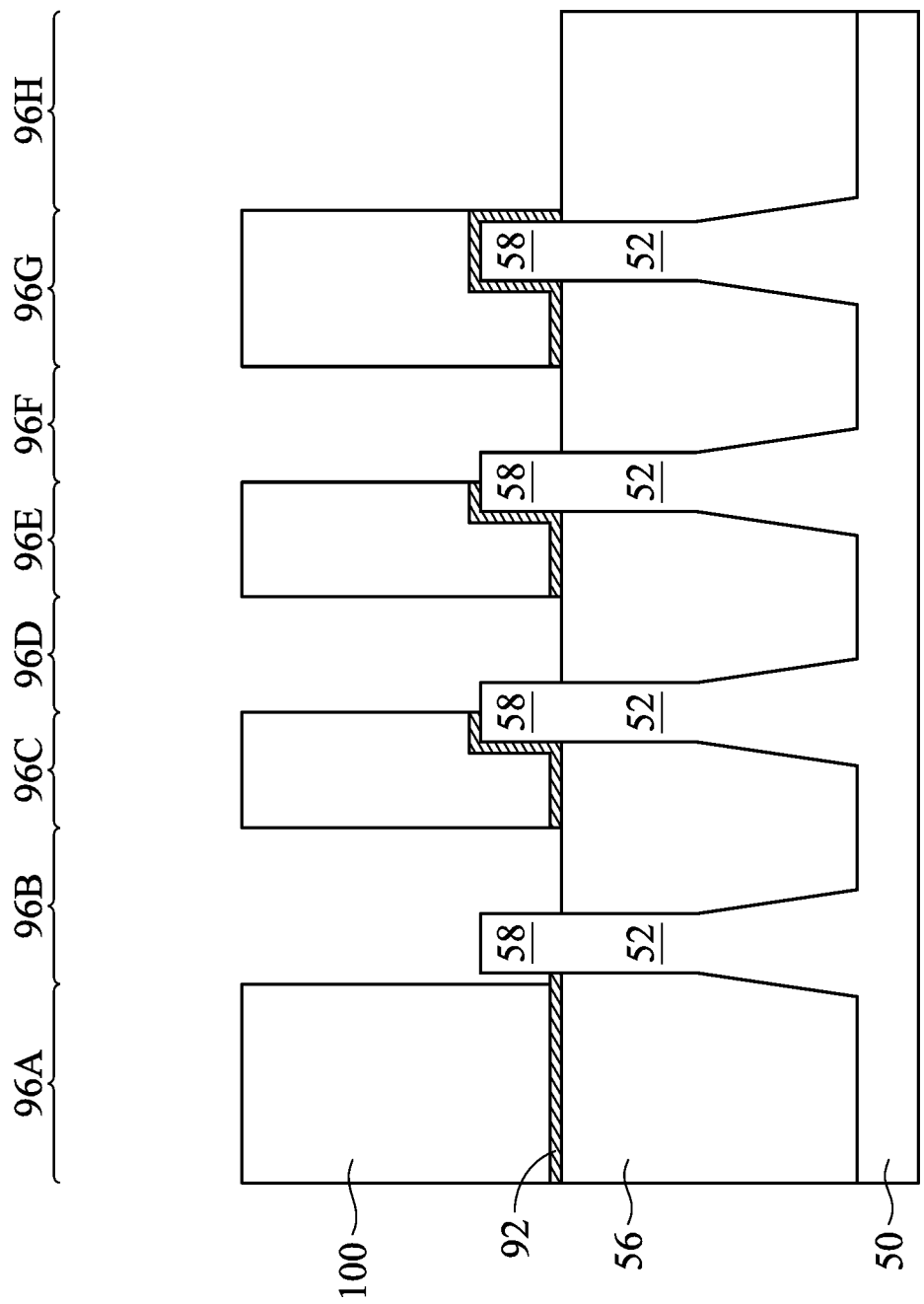

In FIG. 18, the second intermediate mask layer 104, and the first intermediate mask layer 102 are etched from the first region 96A, the third region 96C, the fifth region 96E, and the seventh region 96G, and the first gate dielectric layer 92 is etched from the second region 96B, the fourth region 96D, the sixth region 96F, and the eighth region 96H. The first gate dielectric layer 92 is an example of a target layer according to some embodiments. The second intermediate mask layer 104, the first intermediate mask layer 102, and the first gate dielectric layer 92 may be etched using one or more wet etch processes. For example, the second intermediate mask layer 104, the first intermediate mask layer 102, and the first gate dielectric layer 92 may be etched by one or more wet etch processes using etch solutions including ozonated de-ionized water, diluted hydrofluoric acid (dHF), ammonia, combinations thereof, or the like. Although the first gate dielectric layer 92 is described as being removed by the etching processes described in relation to FIG. 18, in some embodiments, at least a portion of the first gate dielectric layer 92 may not be removed from the second region 96B, the fourth region 96D, the sixth region 96F, and the eighth region 96H.

Figure 19A:
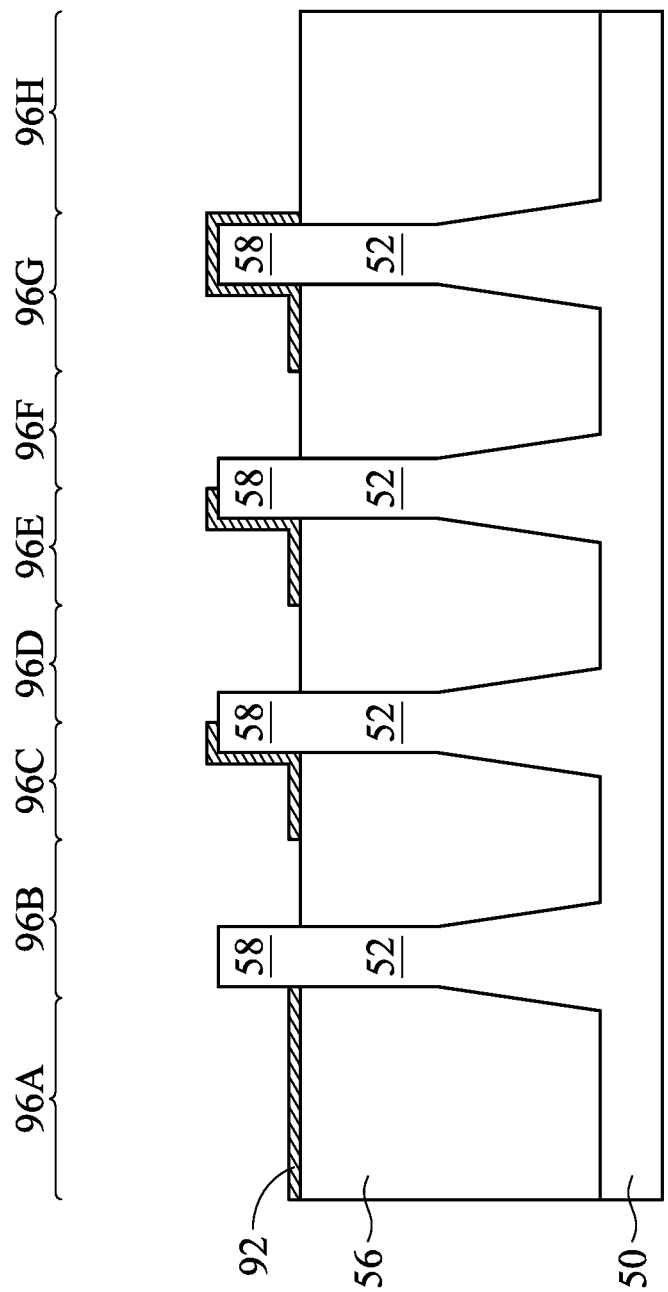

In FIG. 19A, the remainder of the first BARC layer 100 is removed from the first region 96A, the third region 96C, the fifth region 96E, and the seventh region 96G. In at least one embodiment, the first BARC layer 100 may be removed by plasma ashing or the like. In various embodiments, the first BARC layer 100 may be removed by a plasma ashing process using a process gas including nitrogen ($N_2$), hydrogen ($H_2$), combinations thereof, or the like. Further in FIG. 19A, a wet etch process, such as a wet etch using an etch solution including dHF, may be performed to remove any oxides or other impurities remaining on the fins 52, the STI regions 56, or the first gate dielectric layer 92.

Using the four-layer photoresist 107 described above to pattern the first gate dielectric layer 92 prevents damage to the first BARC layer 100, which can cause rounding of the first BARC layer 100 (e.g., rounding of the corners of the first BARC layer 100 in a top-down view) and the underlying layers patterned through the first BARC layer 100. As such, the first gate dielectric layer 92 may be precisely patterned using the first BARC layer 100 as a mask. This improves device performance and decreases defects in devices formed according to the methods described above.

Figure 19B:
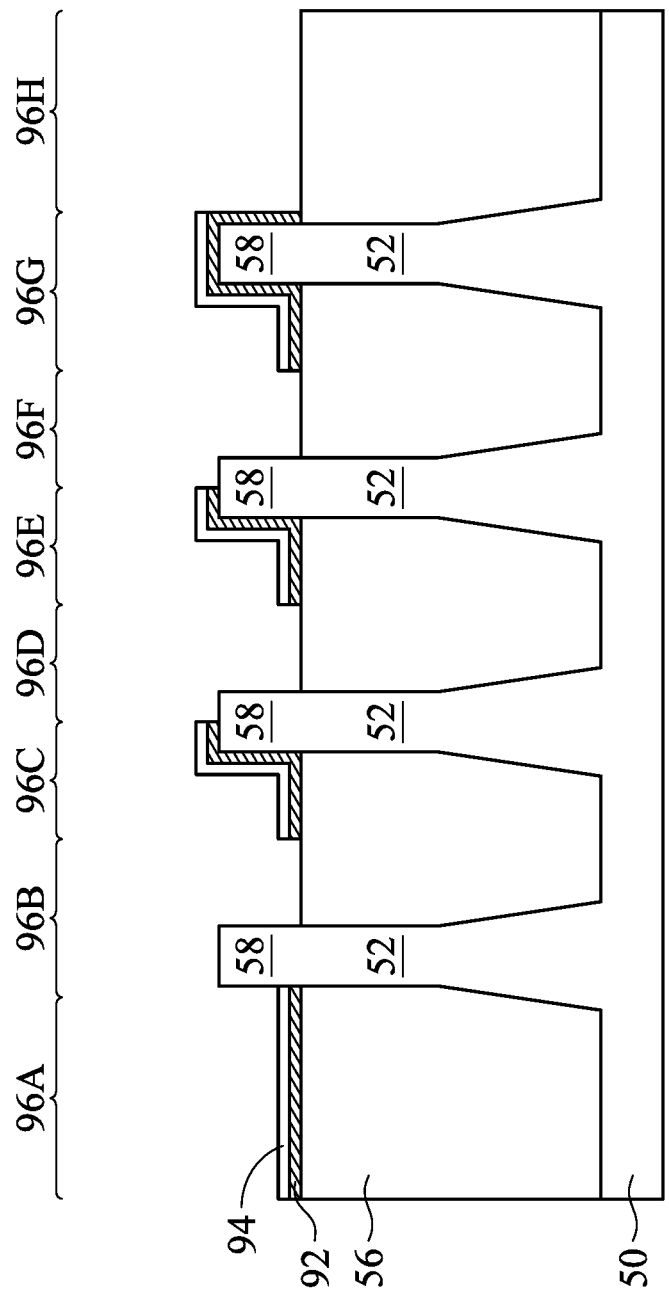

FIG. 19B illustrates an embodiment in which a first work function layer 94 is conformally deposited over the first gate dielectric layer 92 illustrated in FIG. 14, the four-layer photoresist 107 is deposited over the first work function layer 94, and the four-layer photoresist 107 is used to etch both the first work function layer 94 and the first gate dielectric layer 92. The first work function layer 94 may be formed by a deposition process, such as ALD, CVD, PECVD, PVD, sputter deposition, or the like. In embodiments in which the first work function layer 94 is formed over the region 50P (e.g., the PMOS region), the first work function layer 94 may be made of, for example, TiN, W, Ta, Ni, Pt, Ru, Mo, Al, WN, combinations thereof, or the like. In embodiments in which the first work function layer 94 is formed over the region 50N (e.g., the NMOS region), the first work function layer 94 may be made of, for example, Ti, Ag, Al, TiAlMo, Ta, TaN, TiAlC, TiAlN, TaC, TaCN, TiAl, TaSiN, Mn, Zr, combinations thereof, or the like. The first work function layer 94 may comprise a single layer or multiple layers. The first work function layer 94 may have a thickness of between about 8 Å and about 10 Å, such as about 9 Å.

In some embodiments, a barrier layer (not separately illustrated) is optionally formed between the first work function layer 94 and the first gate dielectric layer 92. The barrier layer may be a metal layer and may be formed of, for example, TaN or the like. The barrier layer may be formed by a deposition process, such as ALD, CVD, PECVD, PVD, sputter deposition, or the like. The barrier layer may have a thickness of between about 12 Å and about 18 Å, such as about 15 Å.

The four-layer photoresist 107, the first work function layer 94, and the first gate dielectric layer 92 may be patterned according to the methods described above with respect to FIGS. 16-19A. The first gate dielectric layer 92 and the first work function layer 94 are examples of target layers according to some embodiments. The etchants used to etch the first work function layer 94 may further include etchants such as ammonium hydroxide ($NH_4OH$), hydrogen peroxide ($H_2O_2$), deionized water (DIW), any other chemicals used to etch work function layers, combinations thereof, or the like. As illustrated in FIG. 19B, portions of the first work function layer 94 and the first gate dielectric layer 92 may remain in the first region 96A, the third region 96C, the fifth region 96E, and the seventh region 96G after the selective etching of the first work function layer 94 and the first gate dielectric layer 92.

Figure 20:
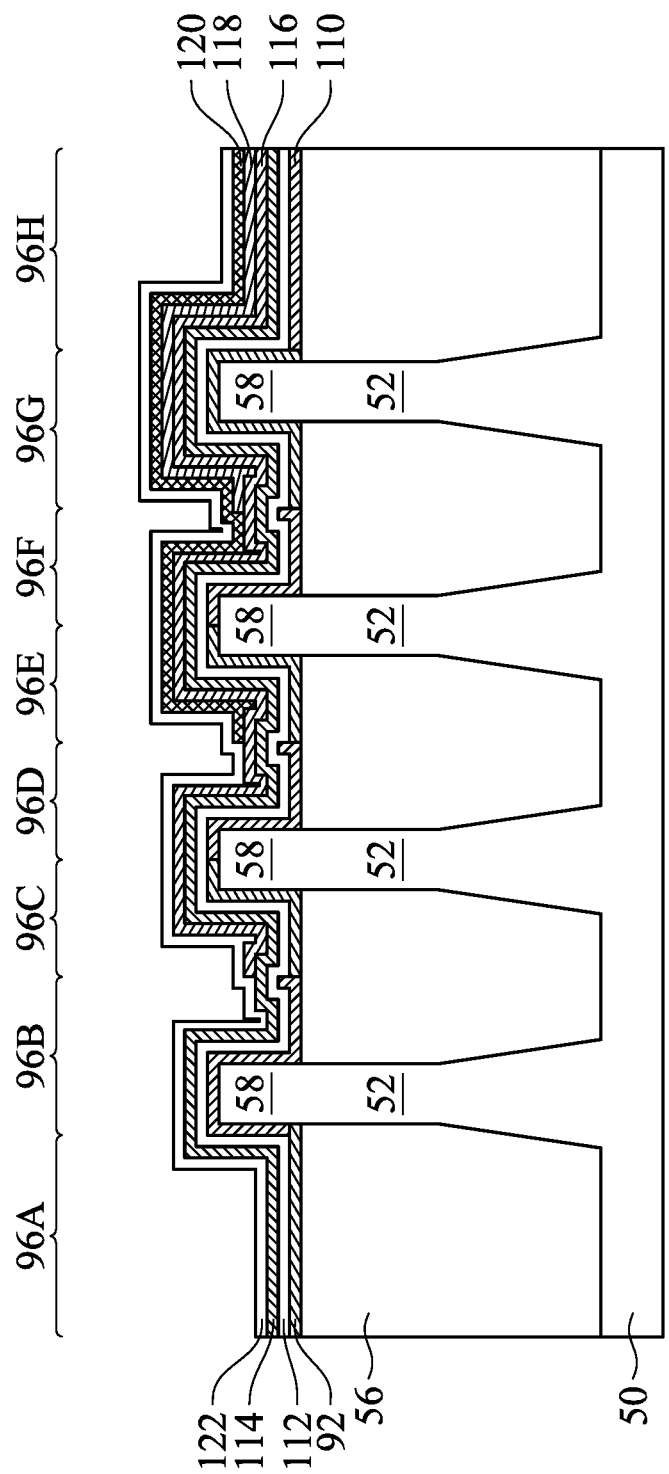

In FIG. 20, a second gate dielectric layer 110 is formed over the STI regions 56 and the fins 52 in the second region 96B, the fourth region 96D, the sixth region 96F, and the eighth region 96H. A first work function layer 112 and a second work function layer 114 are formed over the first gate dielectric layer 92 and the second gate dielectric layer 110 in the first region 96A, the second region 96B, the third region 96C, the fourth region 96D, the fifth region 96E, the sixth region 96F, the seventh region 96G, and the eighth region 96H. A third work function layer 116 is formed over the second work function layer 114 in the third region 96C, the fourth region 96D, the fifth region 96E, the sixth region 96F, the seventh region 96G, and the eighth region 96H. A fourth work function layer 118 is formed over the third work function layer 116 in the seventh region 96G and the eighth region 96H. A fifth work function layer 120 is formed over the third work function layer 116 and the fourth work function layer 118 in the fifth region 96E, the sixth region 96F, the seventh region 96G, and the eighth region 96H. A sixth work function layer 122 is formed over the second work function layer 114, the third work function layer 116, and the fifth work function layer in the first region 96A, the second region 96B, the third region 96C, the fourth region 96D, the fifth region 96E, the sixth region 96F, the seventh region 96G, and the eighth region 96H.

The second gate dielectric layer 110 may be formed by the same or a similar process as the first gate dielectric layer 92. For example, the second gate dielectric layer 110 is conformally deposited over the structure of FIG. 19A. The second gate dielectric layer 110 may be deposited by molecular beam deposition (MBD), atomic layer deposition (ALD), PECVD, and the like. The second gate dielectric layer 110 may comprise silicon oxide, silicon nitride, or multilayers thereof. In some embodiments, the second gate dielectric layer 110 is a high-k dielectric material, and in these embodiments, the second gate dielectric layer 110 may have a k value greater than about 7.0, and may include a metal oxide or a silicate of Hf, Al, Zr, La, Mg, Ba, Ti, Pb, and combinations thereof. The second gate dielectric layer 110 may have a thickness of between about 13 Å and about 19 Å, such as about 16 Å.

After the second gate dielectric layer 110 is deposited, the second gate dielectric layer 110 may be selectively etched from the first region 96A, the third region 96C, the fifth region 96E, and the seventh region 96G using the four-layer photoresist 107 and the patterning method described above with respect to FIGS. 15-19A. The second gate dielectric layer 110 is an example of a target layer according to some embodiments. After selectively etching the second gate dielectric layer 110, portions of the second gate dielectric layer 110 may remain in the second region 96B, the fourth region 96D, the sixth region 96F, and the eighth region 96H. In various embodiments, the first gate dielectric layer 92 and the second gate dielectric layer 110 comprise different materials and the deposition and patterning of the first gate dielectric layer 92 and the second gate dielectric layer 110 over the fins 52 may be used to determine electrical characteristics, such as threshold voltage, of the various fins 52.

The first work function layer 112 is deposited conformally over the first gate dielectric layer 92 and the second gate dielectric layer 110. The first work function layer 112 may be formed by a deposition process, such as ALD, CVD, PECVD, PVD, sputter deposition, or the like. In embodiments in which the first work function layer 112 is formed over the region 50P (e.g., the PMOS region), the first work function layer 112 may be made of, for example, TiN, W, Ta, Ni, Pt, Ru, Mo, Al, WN, combinations thereof, or the like. In embodiments in which the first work function layer 112 is formed over the region 50N (e.g., the NMOS region), the first work function layer 112 may be made of, for example, Ti, Ag, Al, TiAlMo, Ta, TaN, TiAlC, TiAlN, TaC, TaCN, TiAl, TaSiN, Mn, Zr, combinations thereof, or the like. The first work function layer 112 may comprise a single layer or multiple layers. The first work function layer 112 may have a thickness of between about 8 Å and about 10 Å, such as about 9 Å.

In some embodiments, a barrier layer (not separately illustrated) is optionally formed between the first work function layer 112 and the first gate dielectric layer 92 and the second gate dielectric layer 110. The barrier layer may be a metal layer and may be formed of, for example, TaN or the like. The barrier layer may be formed by a deposition process, such as ALD, CVD, PECVD, PVD, sputter deposition, or the like. The barrier layer may have a thickness of between about 12 Å and about 18 Å, such as about 15 Å.

The second work function layer 114 is deposited conformally over the first work function layer 112. The second work function layer 114 may be formed by a deposition process, such as ALD, CVD, PECVD, PVD, sputter deposition, or the like. In embodiments in which the second work function layer 114 is formed over the region 50P (e.g., the PMOS region), the second work function layer 114 may be made of, for example, TiN, W, Ta, Ni, Pt, Ru, Mo, Al, WN, combinations thereof, or the like. In embodiments in which the second work function layer 114 is formed over the region 50N (e.g., the NMOS region), the second work function layer 114 may be made of, for example, Ti, Ag, Al, TiAlMo, Ta, TaN, TiAlC, TiAlN, TaC, TaCN, TiAl, TaSiN, Mn, Zr, combinations thereof, or the like. The second work function layer 114 may comprise a single layer or multiple layers. The second work function layer 114 may have a thickness of between about 8 Å and about 10 Å, such as about 9 Å.

The third work function layer 116 is deposited conformally over the second work function layer 114. The third work function layer 116 may be formed by a deposition process, such as ALD, CVD, PECVD, PVD, sputter deposition, or the like. In embodiments in which the third work function layer 116 is formed over the region 50P (e.g., the PMOS region), the third work function layer 116 may be made of, for example, TiN, W, Ta, Ni, Pt, Ru, Mo, Al, WN, combinations thereof, or the like. In embodiments in which the third work function layer 116 is formed over the region 50N (e.g., the NMOS region), the third work function layer 116 may be made of, for example, Ti, Ag, Al, TiAlMo, Ta, TaN, TiAlC, TiAlN, TaC, TaCN, TiAl, TaSiN, Mn, Zr, combinations thereof, or the like. The third work function layer 116 may comprise a single layer or multiple layers. The third work function layer 116 may have a thickness of between about 8 Å and about 10 Å, such as about 9 Å. After the third work function layer 116 is deposited, the third work function layer 116 may be selectively etched from the first region 96A and the second region 96B using an additional four-layer photoresist 107 and the patterning method described above with respect to FIGS. 15-19A. The third work function layer 116 is an example of a target layer according to some embodiments. The etching processes used to remove the third work function layer 116 may further include etchants such as ammonium hydroxide (NH$_4$OH), hydrogen peroxide (H$_2$O$_2$), deionized water (DIW), any other chemicals used to etch work function layers, combinations thereof, or the like. After the selective etching of the third work function layer 116, portions of the third work function layer 116 may remain in the third region 96C, the fourth region 96D, the fifth region 96E, the sixth region 96F, the seventh region 96G, and the eighth region 96H.

The fourth work function layer 118 is deposited conformally over the second work function layer 114 and the third work function layer 116. The fourth work function layer 118 may be formed by a deposition process, such as ALD, CVD, PECVD, PVD, sputter deposition, or the like. In embodiments in which the fourth work function layer 118 is formed over the region 50P (e.g., the PMOS region), the fourth work function layer 118 may be made of, for example, TiN, W, Ta, Ni, Pt, Ru, Mo, Al, WN, combinations thereof, or the like. In embodiments in which the fourth work function layer 118 is formed over the region 50N (e.g., the NMOS region), the fourth work function layer 118 may be made of, for example, Ti, Ag, Al, TiAlMo, Ta, TaN, TiAlC, TiAlN, TaC, TaCN, TiAl, TaSiN, Mn, Zr, combinations thereof, or the like. The fourth work function layer 118 may comprise a single layer or multiple layers. The fourth work function layer 118 may have a thickness of between about 8 Å and about 10 Å, such as about 9 Å. After the fourth work function layer 118 is deposited, the fourth work function layer 118 may be selectively etched from the first region 96A, the second region 96B, the third region 96C, the fourth region 96D, the fifth region 96E, and the sixth region 96F using an additional four-layer photoresist 107 and the patterning method described above with respect to FIGS. 15-19A. The fourth work function layer 118 is an example of a target layer according to some embodiments. After the selective etching of the fourth work function layer 118, portions of the fourth work function layer 118 may remain in the seventh region 96G and the eighth region 96H.

The fifth work function layer 120 is deposited conformally over the second work function layer 114, the third work function layer 116, and the fourth work function layer 118. The fifth work function layer 120 may be formed by a deposition process, such as ALD, CVD, PECVD, PVD, sputter deposition, or the like. In embodiments in which the fifth work function layer 120 is formed over the region 50P (e.g., the PMOS region), the fifth work function layer 120 may be made of, for example, TiN, W, Ta, Ni, Pt, Ru, Mo, Al, WN, combinations thereof, or the like. In embodiments in which the fifth work function layer 120 is formed over the region 50N (e.g., the NMOS region), the fifth work function layer 120 may be made of, for example, Ti, Ag, Al, TiAlMo, Ta, TaN, TiAlC, TiAlN, TaC, TaCN, TiAl, TaSiN, Mn, Zr, combinations thereof, or the like. The fifth work function layer 120 may comprise a single layer or multiple layers. The fifth work function layer 120 may have a thickness of between about 8 Å and about 10 Å, such as about 9 Å. After the fifth work function layer 120 is deposited, the fifth work function layer 120 may be selectively etched from the first region 96A, the second region 96B, the third region 96C, and the fourth region 96D using an additional four-layer photoresist 107 and the patterning method described above with respect to FIGS. 15-19A. The fifth work function layer 120 is an example of a target layer according to some embodiments. After the selective etching of the fifth work function layer 120, portions of the fifth work function layer 120 may remain in the fifth region 96E, the sixth region 96F, the seventh region 96G, and the eighth region 96H.

The sixth work function layer 122 is deposited conformally over the second work function layer 114, the third work function layer 116, and the fifth work function layer 120. The sixth work function layer 122 may be formed by a deposition process, such as ALD, CVD, PECVD, PVD, sputter deposition, or the like. In embodiments in which the sixth work function layer 122 is formed over the region 50P (e.g., the PMOS region), the sixth work function layer 122 may be made of, for example, TiN, W, Ta, Ni, Pt, Ru, Mo, Al, WN, combinations thereof, or the like. In embodiments in which the sixth work function layer 122 is formed over the region 50N (e.g., the NMOS region), the sixth work function layer 122 may be made of, for example, Ti, Ag, Al, TiAlMo, Ta, TaN, TiAlC, TiAlN, TaC, TaCN, TiAl, TaSiN, Mn, Zr, combinations thereof, or the like. The sixth work function layer 122 may comprise a single layer or multiple layers. The sixth work function layer 122 may have a thickness of between about 8 Å and about 10 Å, such as about 9 Å.

The thicknesses provided for the first work function layer 112, the second work function layer 114, the third work function layer 116, the fourth work function layer 118, the fifth work function layer 120, the sixth work function layer 122 and the barrier layer allow for a desired electrical performance. However, other thicknesses are possible, depending on the application and the desired electrical performance. Moreover, the deposition and patterning techniques discussed in reference to FIGS. 14-20 may be used to form any number of gate dielectric layers and any number of work function layers in any number of regions with any pattern depending on the desired electrical performance. The structure illustrated in FIG. 21A is merely a specific embodiment illustrating a possible combination of deposited and selectively etched gate dielectric layers and work function layers, and other configurations are also possible.

The different work function layers and gate dielectric layers included in each of the first region 96A, the second region 96B, the third region 96C, the fourth region 96D, the fifth region 96E, the sixth region 96F, the seventh region 96G, and the eighth region 96H produce different electrical performance in each of the fins 52. This produces a multi-threshold voltage ($V_{th}$) gate, which may be used in an electronic component, such as a transistor. Including a multi-threshold voltage gate allows for speed, delay, and power to be optimized in a semiconductor device.

The first gate dielectric layer 92, the second gate dielectric layer 110, the third work function layer 116, the fourth work function layer 118, and the fifth work function layer 120 are patterned using the four-layer photoresist 107 and are examples of target layers according to various embodiments.

Figure 21A:
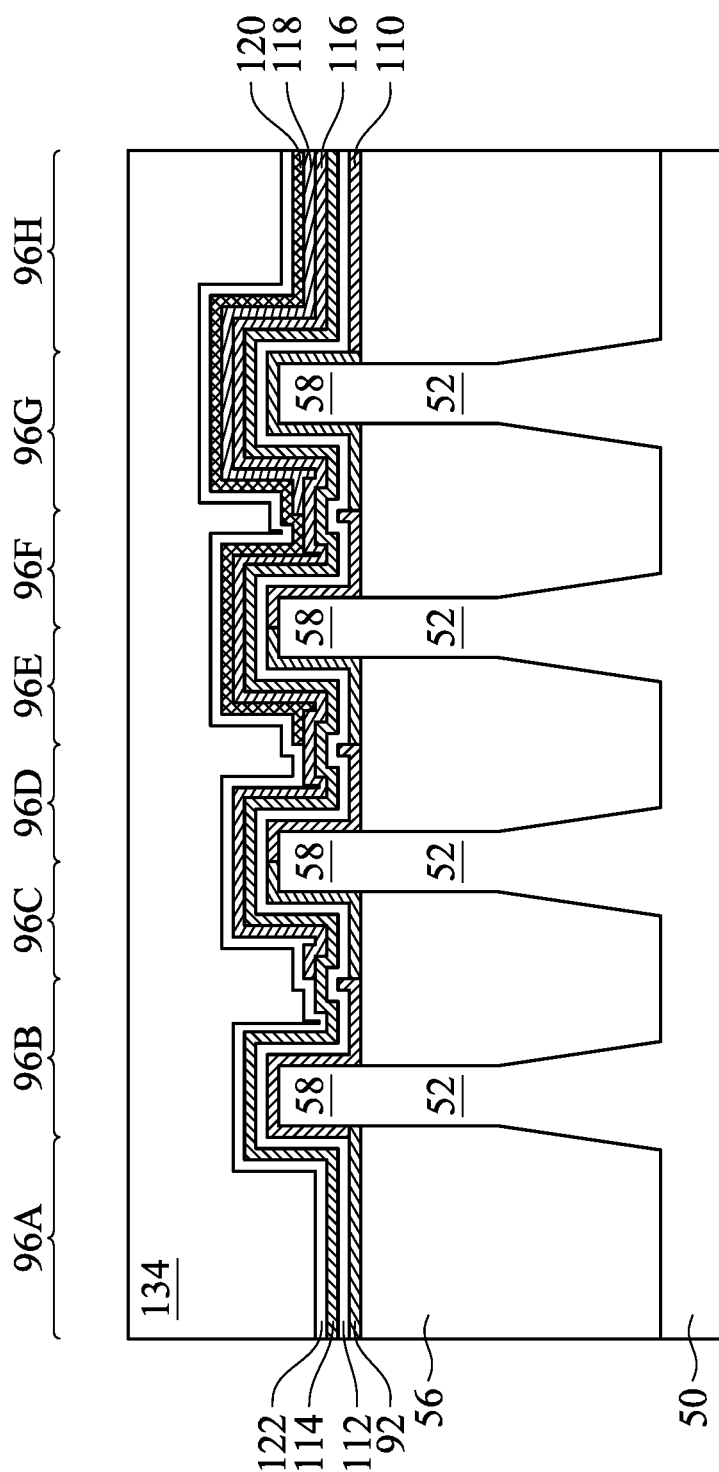

In FIG. 21A, gate electrodes 134 are formed on the sixth work function layer 122. In FIG. 21A, each of the gate dielectric layers (e.g., the first gate dielectric layer 92 and the second gate dielectric layer 110) and work function layers (e.g., the first work function layer 112, the second work function layer 114, the third work function layer 116, the fourth work function layer 118, the fifth work function layer 120, and the sixth work function layer 122) is illustrated. However, FIGS. 21B-23B have been simplified for illustrative purposes. Specifically, in FIGS. 21B-23B, the first gate dielectric layer 92 and the second gate dielectric layer 110 are illustrated as gate dielectric layer 130 and the first work function layer 112, the second work function layer 114, the third work function layer 116, the fourth work function layer 118, the fifth work function layer 120, and the sixth work function layer 122 are illustrated as work function layer 132. The materials of each work function layer and each dielectric layer may be selected according to desired electrical performance and may be the same as, or different from other layers in the gate structure. Any combination of the materials described above may be used for the work function layers and the dielectric layers.

Figure 21B:
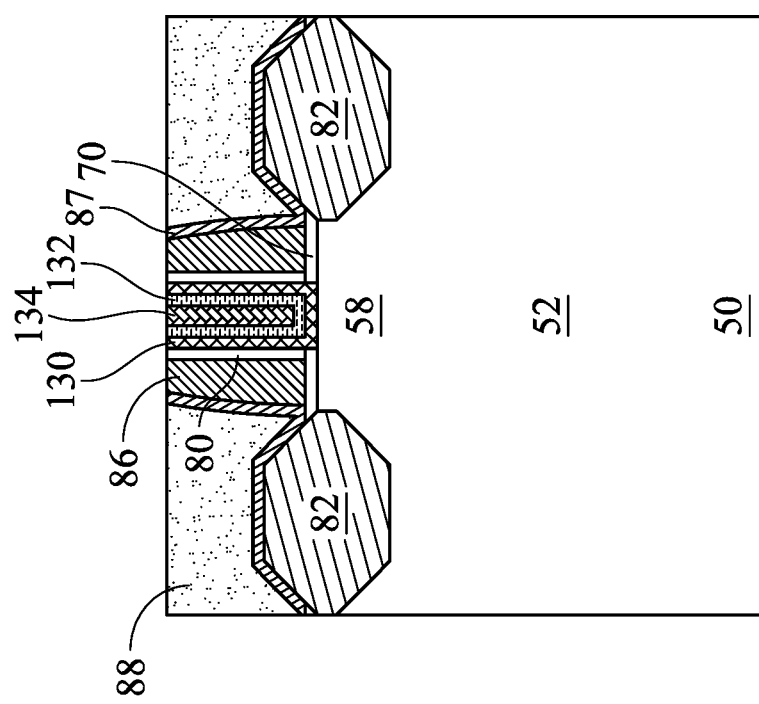

As illustrated in FIG. 21B, the gate dielectric layers 130 and the work function layers 132 are deposited conformally in the recesses 90 (illustrated in FIG. 13B), such as on the top surfaces and the sidewalls of the fins 52 and on sidewalls of the gate seal spacers 80/gate spacers 86. The gate dielectric layers 130 and the work function layers 132 may also be formed over a top surface of the first ILD 88 and subsequently removed, as discussed below.

The gate electrodes 134 are deposited over the work function layers 132 and fill the remaining portions of the recesses 90. The gate electrodes 134 may include a metal-containing material such as TiN, TiO, TaN, TaC, Co, Ru, Al, W, combinations thereof, or multi-layers thereof. After the filling of the gate electrodes 134, a planarization process, such as a CMP, may be performed to remove the excess portions of the gate dielectric layers 130, the work function layers 132, and the material of the gate electrodes 134, which excess portions are over the top surface of the first ILD 88. The remaining portions of material of the gate electrodes 134, the work function layers 132, and the gate dielectric layers 130 thus form replacement gates of the resulting FinFETs. The gate electrodes 134, the work function layers 132 and the gate dielectric layers 130 may be collectively referred to as a "gate stack." The gate and the gate stacks may extend along sidewalls of a channel region 58 of the fins 52.

The formation of the gate dielectric layers 130, the work function layers 132, and the gate electrodes 134 in the region 50N and the region 50P may occur simultaneously such that the gate dielectric layers 130, the work function layers 132, and the gate electrodes 134 in each region are formed from the same materials. In some embodiments, any of the gate dielectric layers 130, the work function layers 132, and the gate electrodes 134 in each region may be formed by distinct processes, such that the gate dielectric layers 130, the work function layers 132, and/or the gate electrodes 134 may be different materials. Various masking steps using the four-layer photoresist 107 may be used to mask and expose appropriate regions when using distinct processes.

In FIGS. 22A and 22B, a second ILD 138 is deposited over the first ILD 88. In some embodiment, the second ILD 138 is a flowable film formed by a flowable CVD method. In some embodiments, the second ILD 138 is formed of a dielectric material such as PSG, BSG, BPSG, USG, or the like, and may be deposited by any suitable method, such as CVD and PECVD. In accordance with some embodiments, before the formation of the second ILD 138, the gate stack (including the gate dielectric layers 130, the work function layers 132, and the gate electrodes 134) is recessed, so that a recess is formed directly over the gate stack and between opposing portions of the gate spacers 86, as illustrated in FIGS. 22A and 22B. A gate mask 136 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 140 (FIGS. 23A and 23B) penetrate through the gate mask 136 to contact the top surface of the recessed gate electrodes 134.

Figure 23B:
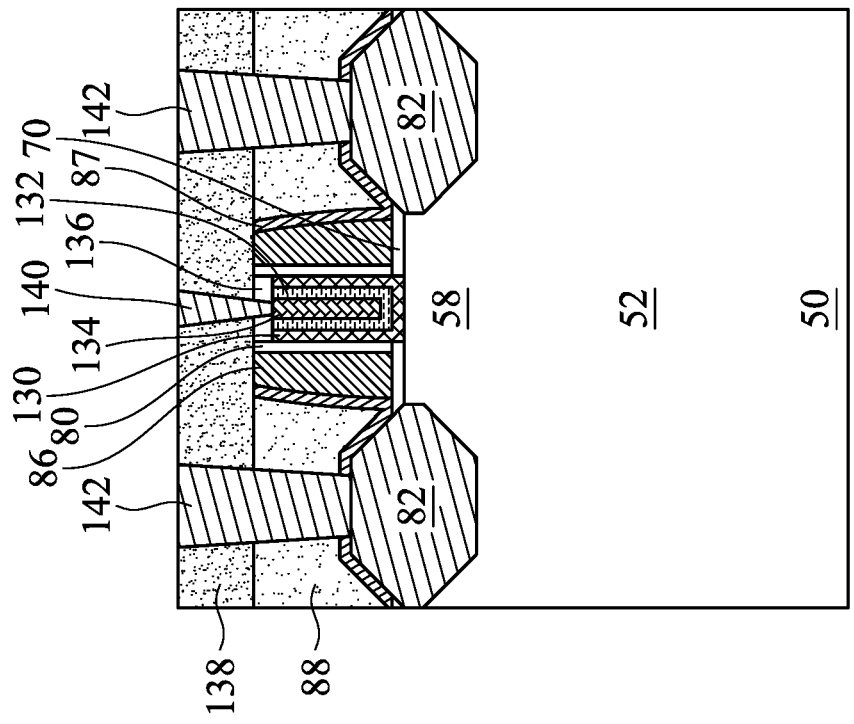
Figure 23A:
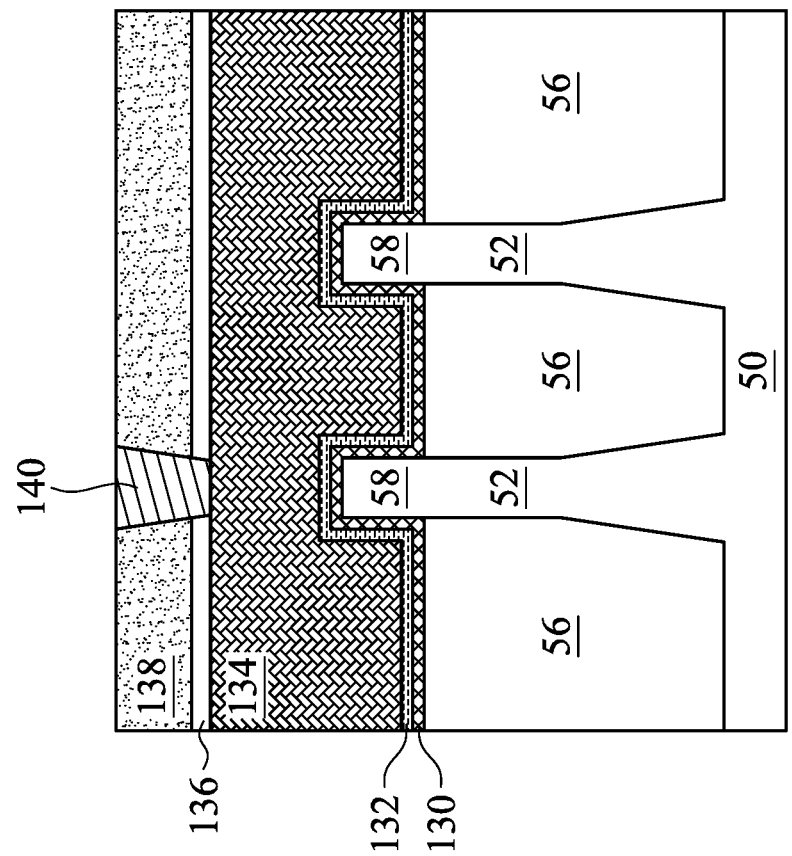

In FIGS. 23A and 23B, gate contacts 140 and source/drain contacts 142 are formed through the second ILD 138 and the first ILD 88 in accordance with some embodiments. Openings for the source/drain contacts 142 are formed through the first ILD 88 and the second ILD 138, and openings for the gate contact 140 are formed through the second ILD 138 and the gate mask 136. The openings may be formed using acceptable photolithography and etching techniques. A liner, which may include a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 138. The remaining liner and conductive material form the source/drain contacts 142 and gate contacts 140 in the openings. An anneal process may be performed to form a silicide at the interface between the epitaxial source/drain regions 82 and the source/drain contacts 142. The source/drain contacts 142 are physically and electrically coupled to the epitaxial source/drain regions 82, and the gate contacts 140 are physically and electrically coupled to the gate electrodes 134. The source/drain contacts 142 and gate contacts 140 may be formed in different processes, or may be formed in the same process. Although shown as being formed in the same cross-sections, it should be appreciated that each of the source/drain contacts 142 and the gate contacts 140 may be formed in different cross-sections, which may avoid shorting of the contacts.

As described previously, forming the four-layer photoresist 107 including the first intermediate mask layer 102, formed by a low-temperature, low-RF power process, and the second intermediate mask layer 104, formed by a low-temperature, high-RF power process, allows for the four-layer photoresist 107 to be formed without damaging the first BARC layer 100. This prevents rounding (e.g., rounding of the corners of the first BARC layer 100 in a top-down view) of the first BARC layer 100 and underlying gate dielectric layers and work function layers patterned using the first BARC layer 100 as a mask and provides for increasingly precise patterning of the underlying gate dielectric layers and work function layers. The four-layer photoresist 107 may be used in a process to form a multi-threshold voltage ($V_{th}$) gate, which may have optimized device speed, delay, and power. Further, devices formed according to the above-described methods experience improved device performance and decreased defects.

In accordance with an embodiment, a method includes forming a semiconductor fin extending from a substrate; depositing a target layer on the semiconductor fin; depositing a bottom anti-reflective coating (BARC) layer on the target layer; depositing a first mask layer over the BARC layer, the first mask layer being deposited using a plasma process with an RF power of less than 50 W; depositing a second mask layer over the first mask layer, the second mask layer being deposited using a plasma process with an RF power of less than 500 W; depositing a photoresist layer over the second mask layer; patterning the photoresist layer, the second mask layer, the first mask layer, and the BARC layer to form a first mask; and selectively removing the target layer from a first portion of the semiconductor fin using the first mask as a mask, the target layer remaining on a second portion of the semiconductor fin. In an embodiment, the first mask layer and the second mask layer are deposited at a temperature of between 50° C. and 150° C. In an embodiment, the photoresist layer is removed after patterning the BARC layer, before selectively removing the target layer. In an embodiment, the first mask layer and the second mask layer are deposited from a precursor gas comprising N-(Diethylaminosilyl)-N-ethylethanamine. In an embodiment, depositing the first mask layer includes flowing the precursor gas over the BARC layer; and after flowing the precursor gas, performing an oxygen plasma treatment to form the first mask layer. In an embodiment, the BARC layer and the photoresist layer are deposited by spin-on coating, and the first mask layer and the second mask layer are deposited by plasma-enhanced atomic layer deposition (PEALD). In an embodiment, the first mask layer and the second mask layer are deposited at a pressure of between 2.7 Torr and 3.3 Torr. In an embodiment, the first mask layer includes silicon oxide having an atomic ratio of silicon-to-oxide of less than 0.71, and the second mask layer includes silicon oxide having an atomic ratio of silicon-to-oxide of greater than 0.75.

In accordance with another embodiment, a method includes depositing a dielectric layer over a fin extending from a substrate; depositing a work function layer over the dielectric layer; forming a photoresist mask over the work function layer, forming the photoresist mask including depositing a bottom anti-reflective coating (BARC) layer over and in physical contact with the work function layer; depositing a hard mask over the BARC layer at a temperature of between 50° C. and 150° C., the hard mask including a first hard mask layer over the BARC layer; and a second hard mask layer over the first hard mask layer, the first hard mask layer and the second hard mask layer including silicon oxide, the first hard mask layer having a first silicon-to-oxide ratio, the second hard mask layer having a second silicon-to-oxide ratio, the second silicon-to-oxide ratio being greater than the first silicon-to-oxide ratio; and depositing a photoresist layer over the hard mask; and etching portions of the work function layer and the dielectric layer using the photoresist mask as a mask, portions of the work function layer and the dielectric layer remaining on the fin after etching the portions of the work function layer and the dielectric layer. In an embodiment, the work function layer includes multiple layers, and etching the portions of the work function layer and the dielectric layer removes one or more layers of the work function layer. In an embodiment, the first silicon-to-oxide ratio is less than 0.71 and the second silicon-to-oxide ratio is greater than 0.75. In an embodiment, the first hard mask layer is deposited using an RF power of less than 50 W and the second hard mask layer is deposited using an RF power of less than 500 W. In an embodiment, forming the photoresist mask further includes patterning the photoresist layer to expose a portion of the hard mask; etching the portion of the hard mask to expose a portion of the BARC layer using the photoresist layer as a mask; etching the portion of the BARC layer to expose the work function layer using the hard mask as a mask; removing a remaining portion of the hard mask; and after removing the remaining portion of the hard mask, etching the work function layer using the BARC layer as a mask. In an embodiment, the BARC layer and the photoresist layer are deposited by spin-on coating and the hard mask is deposited using plasma-enhanced atomic layer deposition (PEALD). In an embodiment, the first hard mask layer has a thickness of between 10 and 100 Å and the second hard mask layer has a thickness of between 100 and 500 Å.

In accordance with yet another embodiment, a method includes forming a plurality of semiconductor fins extending from a semiconductor substrate; depositing a first gate dielectric layer over the semiconductor fins; forming a photoresist over the first gate dielectric layer, forming the photoresist including spin-on coating a BARC layer on the first gate dielectric layer; depositing a first hard mask layer over the BARC layer using a first deposition process with an RF power of 50 W or less; depositing a second hard mask layer over the first hard mask layer using a second deposition process with an RF power of 500 W or less, the second hard mask layer having a hardness greater than a hardness of the first hard mask layer; spin-on coating a photoresist layer over the second hard mask layer; and patterning the photoresist layer, the second hard mask layer, the first hard mask layer, and the BARC layer; etching the first gate dielectric layer to remove a portion of the first gate dielectric layer using the photoresist as a mask; and depositing a second gate dielectric layer over the first gate dielectric layer and the semiconductor fins, the second gate dielectric layer and the first gate dielectric layer contacting portions of the semiconductor fins. In an embodiment, the method further includes forming a second photoresist over the first gate dielectric layer, forming the second photoresist including spin-on coating a second BARC layer on the second gate dielectric layer; depositing a third hard mask layer over the BARC layer using a third deposition process with an RF power of 50 W or less; depositing a fourth hard mask layer over the third hard mask layer using a fourth deposition process with an RF power of 500 W or less, the fourth hard mask layer having a hardness greater than a hardness of the third hard mask layer; spin-on coating a second photoresist layer over the fourth hard mask layer; and patterning the second photoresist layer, the fourth hard mask layer, the third hard mask layer, and the second BARC layer; and etching the second gate dielectric layer to remove a portion of the second gate dielectric layer using the second photoresist as a mask, after etching the second gate dielectric layer, the first gate dielectric layer and the second gate dielectric layer both being in physical contact with portions of one of the semiconductor fins. In an embodiment, the method further includes depositing a first work function layer over the first gate dielectric layer and the second gate dielectric layer; depositing a second work function layer over the first work function layer; forming an additional photoresist over the first gate dielectric layer, forming the additional photoresist including spin-on coating an additional BARC layer on the second work function layer; depositing a first additional hard mask layer over the additional BARC layer using a fifth deposition process with an RF power of 50 W or less; depositing a second additional hard mask layer over the first additional hard mask layer using a sixth deposition process with an RF power of 500 W or less, the second additional hard mask layer having a hardness greater than a hardness of the first additional hard mask layer; spin-on coating an additional photoresist layer over the second additional hard mask layer; and patterning the additional photoresist layer, the second additional hard mask layer, the first additional hard mask layer, and the additional BARC layer; and etching the second work function layer to remove a portion of the second work function layer using the additional photoresist as a mask, the second work function layer being removed from over one of the semiconductor fins, and the second work function layer remaining on another of the semiconductor fins. In an embodiment, the first hard mask layer and the second hard mask layer are deposited at a temperature of less than 150° C. In an embodiment, the first hard mask layer and the second hard mask layer include silicon oxide, the first hard mask layer having an atomic ratio of silicon to oxygen of 0.71 or less, and the second hard mask layer having an atomic ratio of silicon to oxygen of 0.75 or more.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor fin over a substrate;
   depositing a target layer on the semiconductor fin;
   depositing a first mask layer over the target layer, wherein the first mask layer is deposited using a first plasma process with an RF power of less than 50 W;
   depositing a second mask layer over the first mask layer, wherein the second mask layer is deposited using a second plasma process with an RF power greater than the first plasma process and less than 500 W;
   patterning the second mask layer and the first mask layer to form a first mask; and
   selectively removing the target layer from a first portion of the semiconductor fin using the first mask as a mask, the target layer remaining on a second portion of the semiconductor fin.

2. The method of claim 1, wherein the first mask layer and the second mask layer are deposited at a temperature of between 50° C. and 150° C.

3. The method of claim 1, wherein the first mask layer and the second mask layer are deposited from a precursor gas comprising N-(Diethylaminosilyl)-N-ethylethanamine.

4. The method of claim 3, wherein depositing the first mask layer comprises:
   flowing the precursor gas over the target layer; and
   after flowing the precursor gas, performing an oxygen plasma treatment to form the first mask layer.

5. The method of claim 1, wherein the first mask layer and the second mask layer are deposited by plasma-enhanced atomic layer deposition (PEALD).

6. The method of claim 1, wherein the first mask layer and the second mask layer are deposited at a pressure of between 2.7 Torr and 3.3 Torr.

7. The method of claim 1, wherein the first mask layer comprises silicon oxide having an atomic ratio of silicon-to-oxide of less than 0.71, and wherein the second mask layer comprises silicon oxide having an atomic ratio of silicon-to-oxide of greater than 0.75.

8. The method of claim 1, further comprising depositing a bottom anti-reflective coating (BARC) layer over the target layer, wherein the first mask layer is deposited over the BARC layer, and wherein the BARC layer is deposited by spin-on coating.

9. A method comprising:
   depositing a dielectric layer over a fin, the fin extending from a substrate;
   depositing a work function layer over the dielectric layer;
   forming a photoresist mask over the work function layer, wherein forming the photoresist mask comprises depositing a hard mask over the work function layer, the hard mask comprising:
      a first hard mask layer over the work function layer; and
      a second hard mask layer over the first hard mask layer, wherein the first hard mask layer and the second hard mask layer comprise silicon oxide, the first hard mask layer having a first silicon-to-oxide ratio, the second hard mask layer having a second silicon-to-oxide ratio, the second silicon-to-oxide ratio being greater than the first silicon-to-oxide ratio; and
   etching portions of the work function layer and the dielectric layer using the photoresist mask as a mask, wherein portions of the work function layer and the dielectric layer remain on the fin after etching the portions of the work function layer and the dielectric layer.

10. The method of claim 9, wherein the hard mask is deposited at a temperature ranging from 50° C. and 150° C.

11. The method of claim 9, wherein the first silicon-to-oxide ratio is less than 0.71 and the second silicon-to-oxide ratio is greater than 0.75.

12. The method of claim 9, wherein the first hard mask layer is deposited using an RF power of less than 50 W and the second hard mask layer is deposited using an RF power of less than 500 W.

13. The method of claim 9, further comprising depositing a bottom anti-reflective coating (BARC) layer over and in physical contact with the work function layer, wherein the hard mask is deposited over the BARC layer, wherein the BARC layer is deposited by spin-on coating, and wherein the hard mask is deposited using plasma-enhanced atomic layer deposition (PEALD).

14. The method of claim 9, wherein the first hard mask layer has a thickness of between 10 and 100 Å and the second hard mask layer has a thickness of between 100 and 500 Å.

15. The method of claim 9, further comprising:
depositing a photoresist layer over the second hard mask layer by spin-on coating;
patterning the second hard mask layer and the first hard mask layer using the photoresist layer as a second mask; and
removing the photoresist layer before etching the portions of the work function layer and the dielectric layer.

16. A method comprising:
forming a semiconductor fin extending from a semiconductor substrate;
depositing a first gate dielectric layer over the semiconductor fin;
forming a first mask over the first gate dielectric layer, wherein forming the first mask comprises:
depositing a first hard mask layer over the first gate dielectric layer using a first deposition process with an RF power of 50 W or less;
depositing a second hard mask layer over the first hard mask layer using a second deposition process with an RF power of 500 W or less, the second hard mask layer having a hardness greater than a hardness of the first hard mask layer; and
patterning the second hard mask layer and the first hard mask layer;
etching the first gate dielectric layer to remove a portion of the first gate dielectric layer using the first mask as a mask; and
depositing a second gate dielectric layer over the first gate dielectric layer and the semiconductor fin, the second gate dielectric layer and the first gate dielectric layer contacting portions of the semiconductor fin.

17. The method of claim 16, wherein the first hard mask layer and the second hard mask layer comprise silicon oxide, wherein the first hard mask layer has an atomic ratio of silicon to oxygen of 0.71 or less, and wherein the second hard mask layer has an atomic ratio of silicon to oxygen of 0.75 or more.

18. The method of claim 16, wherein the first hard mask layer and the second hard mask layer are deposited by plasma-enhanced atomic layer deposition (PEALD) at a temperature of less than 150° C.

19. The method of claim 16, further comprising:
spin-on coating a BARC layer over the first gate dielectric layer, wherein the first hard mask layer is deposited over the BARC layer; and
spin-on coating a photoresist layer over the second hard mask layer, wherein the second hard mask layer, the first hard mask layer, and the BARC layer are patterned using the photoresist layer as a second mask.

20. The method of claim 16, further comprising:
depositing a first work function layer over the first gate dielectric layer and the second gate dielectric layer;
forming a second mask over the first work function layer, wherein forming the second mask comprises:
depositing a third hard mask layer over the first work function layer using a first deposition process with an RF power of 50 W or less;
depositing a fourth hard mask layer over the third hard mask layer using a second deposition process with an RF power of 500 W or less, the fourth hard mask layer having a hardness greater than a hardness of the first hard mask layer; and
patterning the fourth hard mask layer and the third hard mask layer; and
etching the first work function layer through the second mask to remove a portion of the first work function layer.

* * * * *